(12) United States Patent
Kaneko et al.

(10) Patent No.: US 8,648,397 B2
(45) Date of Patent: Feb. 11, 2014

(54) SEMICONDUCTOR DEVICE, ACTIVE MATRIX SUBSTRATE AND DISPLAY DEVICE

(75) Inventors: Seiji Kaneko, Osaka (JP); Hidehito Kitakado, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/515,921

(22) PCT Filed: Nov. 2, 2010

(86) PCT No.: PCT/JP2010/069462
§ 371 (c)(1),
(2), (4) Date: Jun. 14, 2012

(87) PCT Pub. No.: WO2011/074338
PCT Pub. Date: Jun. 23, 2011

(65) Prior Publication Data
US 2012/0256184 A1    Oct. 11, 2012

(30) Foreign Application Priority Data
Dec. 17, 2009    (JP) .................................. 2009-286440

(51) Int. Cl.
*H01L 29/80* (2006.01)
(52) U.S. Cl.
USPC ................................. 257/257; 257/E33.072
(58) Field of Classification Search
USPC ...................... 257/257, 258, 59, 72, 252–254, 257/E33.072
See application file for complete search history.

(56) References Cited

U.S. PATENT DOCUMENTS

| 6,462,723 B1 | 10/2002 | Yamazaki et al. |
| 7,700,418 B2 * | 4/2010 | Kunii ............................ 438/149 |
| 2003/0025848 A1 | 2/2003 | Sera et al. |

FOREIGN PATENT DOCUMENTS

| JP | 10-070277 A | 3/1998 |
| JP | 2001-051292 A | 2/2001 |
| JP | 2003-131261 A | 5/2003 |
| JP | 2003-243659 A | 8/2003 |

\* cited by examiner

*Primary Examiner* — Quoc Hoang
(74) *Attorney, Agent, or Firm* — Chen Yoshimura LLP

(57) ABSTRACT

A switching element (a semiconductor device) (18) having a top gate electrode (21) and a bottom gate electrode (23) is provided with a silicon layer (a semiconductor layer) (SL) that is arranged between the top gate electrode (21) and the bottom gate electrode (a light-shielding film) (23) and that has a source region (24), a drain region (28), a channel region (26), and low-concentration impurity regions (25, 27). Furthermore, the bottom gate electrode (23) is arranged so as to overlap the channel region (26), a part of the low-concentration impurity region (25), which is adjacent to the source region (24), and a part of the low-concentration impurity region (27), which is adjacent to the drain region (28). The bottom gate electrode (23) is controlled so as to have a prescribed potential.

17 Claims, 16 Drawing Sheets

(a)

(b)

(c)

(a)

(b)

(c)

(a)

(b)

(a)

(b)

Substrate Rear Surface Light  Illuminance (lx)

(a)

(b)

(a)

(b)

SEMICONDUCTOR DEVICE, ACTIVE MATRIX SUBSTRATE AND DISPLAY DEVICE

TECHNICAL FIELD

The present invention relates to a semiconductor device provided with a transistor, and to an active matrix substrate and a display device using the semiconductor device.

BACKGROUND ART

In recent years, liquid crystal display devices have been widely used for liquid crystal televisions, monitors, cellular phones, and the like as flat-panel displays that have advantages such as thinner-profile and lighter-weight as compared with conventional cathode-ray displays, for example. In such liquid crystal display devices, a device using an active matrix substrate for a liquid crystal panel, which is a display panel, is known. In the active matrix substrate, a plurality of data wiring lines (source wiring lines) and a plurality of scan wiring lines (gate wiring lines) are arranged in a matrix, and pixels that respectively include switching elements such as thin-film transistors (hereinafter abbreviated as "TFTs") and pixel electrodes connected to the switching elements are arranged in a matrix near the respective intersections of the data wiring lines and the scan wiring lines.

In such an active matrix substrate, in addition to the thin-film transistors for driving pixels as switching elements, thin-film transistors for peripheral circuits are generally disposed in an integral manner. Further, as the active matrix substrate for a liquid crystal display device with a touch panel or for a liquid crystal display device with an illuminance sensor (an ambient sensor) and the like, an active matrix substrate that has, in addition to the thin-film transistors for driving the pixels and for the peripheral circuits, photodiodes (thin-film diodes; TFDs) disposed integrally therein as photosensors has been disclosed. As described above, semiconductor devices that include a plurality of thin-film transistors and photodiodes are used in the active matrix substrate.

In such a semiconductor device, a reduction in a leak current of the thin-film transistor (transistor) has been increasingly sought after in recent years so as to satisfy the demand for the lower power consumption in a liquid crystal panel having the built-in photosensors, a liquid crystal panel having a built-in pixel memory, and the like, for example.

In response, a conventional semiconductor device that is configured such that a first light-shielding film is provided below the thin-film transistor, and a second light-shielding film is provided between the thin-film transistor and the first light-shielding film has been disclosed as described in Patent Document 1 below, for example. This conventional semiconductor device is configured such that, even when light incoming from the rear surface side of the active matrix substrate was reflected by a black matrix film, data wiring lines, or the first light-shielding film, the light is blocked by the second light-shielding film, and therefore, the leak current is reduced. In addition, the conventional semiconductor device is designed to increase ON current by forming the second light-shielding film of a material with electrical conductivity and by electrically connecting the gate wiring lines to this second light-shielding film so as to form a dual-type thin-film transistor that uses the second light-shielding film as the bottom gate electrode.

RELATED ART DOCUMENT

Patent Document

Patent Document 1: Japanese Patent Application Laid-Open Publication No. 2003-131261

SUMMARY OF THE INVENTION

Problems to be Solved by the Invention

The above-mentioned conventional semiconductor device, however, had a problem that the leak current could not be reduced when the ON current was increased.

Specifically, in the above-mentioned conventional semiconductor device, the second light-shielding film was used as the bottom gate electrode so as to increase the ON current as described above. However, in this conventional semiconductor device, because the second light-shielding film was arranged so as to overlap the channel region, the entire low-concentration impurity region (LDD (Lightly Doped Drain) region), part of the source region, and part of the drain region of the semiconductor layer in the thin-film transistor, when the same voltage was applied to the (top) gate electrode and the second light-shielding film in this conventional semiconductor device, a GOLD (Gate Overlapped LDD) structured thin-film transistor, in which the entire low-concentration impurity region was overlapped with the second light-shielding film (bottom gate electrode), was formed. As a result, in the conventional semiconductor device, when the thin-film transistor was turned off, the (OFF) leak current was increased due to the effect of the vertical electric field in the overlapping regions where the high-concentration impurity regions, which are the source region and the drain region, and the second light-shielding film (the bottom gate electrode) overlap. Thus, in the conventional semiconductor device, it was not possible to achieve both the reduction in the leak current and the increase in the ON current.

The present invention was made in view of the above-mentioned problem, and is aiming at providing a semiconductor device that can achieve both the reduction in the leak current and the increase in the ON current, and an active matrix substrate and a display device using the semiconductor device.

Means for Solving the Problems

In order to achieve the above-mentioned object, a semiconductor device according to the present invention is a transistor comprising:
a top gate electrode;
a bottom gate electrode; and
a semiconductor layer disposed between the top gate electrode and the bottom gate electrode, the semiconductor layer having a source region, a drain region, a channel region, and low-concentration impurity regions,
wherein the bottom gate electrode is arranged so as to overlap the channel region, part of the low-concentration impurity region adjacent to the source region, and part of the low-concentration impurity region adjacent to the drain region, and
wherein the bottom gate electrode is controlled to have a prescribed potential.

In the semiconductor device configured in the manner described above, a semiconductor layer having the source region, the drain region, the channel region, and the low-concentration impurity regions is arranged between the top gate electrode and the bottom gate electrode. In addition, the bottom gate electrode is arranged so as to overlap the channel region, part of the low-concentration impurity region adjacent to the source region, and part of the low-concentration impurity region adjacent to the drain region. Further, the bottom gate electrode is controlled to have a prescribed potential. As a result, in the semiconductor device, the leak current can be reduced even when the ON current is increased, unlike the conventional device.

Furthermore, in the semiconductor layer of the semiconductor device, the low-concentration impurity regions may be formed so as to sandwich the channel region and so as to be offset from the top gate electrode.

In this case, the electric field can be lowered in the semiconductor layer, and thus, the leak current can be further reduced.

In the low-concentration impurity region of the semiconductor device, various low-concentration impurity regions having different impurity concentrations may be arranged.

In this case, the electric field can be lowered in the semiconductor layer, and thus, the leak current can be further reduced.

In the bottom gate electrode of the semiconductor device, it is preferable that the potential of the bottom gate electrode be controlled such that, when the transistor is turned off, the accumulation occurs in the channel region, and the potential of the bottom gate electrode be controlled such that, when the transistor is turned on, the channel region goes into inversion from depletion.

In this case, the ON current can be reliably increased, and the leak current can be reliably reduced.

The semiconductor device may be provided with a light-shielding film disposed below the bottom gate electrode.

In this case, light entering from the bottom side of the bottom gate electrode can be easily blocked by the light-shielding film, and the leak current can be reliably reduced.

The semiconductor device may be provided with a reflective electrode disposed above the top gate electrode.

In this case, a semiconductor device that can be used for a reflective display device can be configured with ease.

In the top gate electrode of the semiconductor device, the potential of the top gate electrode may be controlled by a gate signal from a first signal wiring line that is connected to the top gate electrode, and the potential of the bottom gate electrode may be controlled by capacitance coupling with the top gate electrode.

In this case, the potential of the bottom gate electrode is controlled by the capacitance coupling with the top gate electrode. Therefore, the signal wiring line and the like for applying a prescribed potential to the bottom gate electrode can be omitted, and a semiconductor device with a simple structure can be configured with ease.

In the semiconductor device, the potential of the top gate electrode may be controlled by a gate signal from the first signal wiring line that is connected to the top gate electrode, and the potential of the bottom gate electrode may be controlled by a bottom gate signal from the second signal wiring line that is connected to the bottom gate electrode.

In this case, the potential of the bottom gate electrode is controlled by a bottom gate signal from the second signal wiring line that is connected to the bottom gate electrode. Therefore, the potential of the bottom gate electrode can be controlled more freely, which makes it easier to increase the ON current and to reduce the leak current.

The active matrix substrate of the present invention uses any one of the above-mentioned semiconductor devices.

Because the active matrix substrate configured in such a manner uses the semiconductor device that can reduce the leak current and that can increase the ON current, the active matrix substrate with high performance and low power consumption can be configured with ease.

The display device of the present invention uses any one of the above-mentioned semiconductor devices.

Because the display device configured in such a manner uses the semiconductor device that can reduce the leak current and that can increase the ON current, the display device with high performance and low power consumption can be configured with ease.

Effects of the Invention

According to the present invention, it is possible to provide a semiconductor device that can achieve both the reduction in the leak current and the increase in the ON current, and to provide an active matrix substrate and a display device using the semiconductor device.

BRIEF DESCRIPTION OF THE DRAWINGS

FIGS. 5(a) to 5(c) show a series of principal manufacturing steps.

FIGS. 6(a) to 6(c) show a series of principal manufacturing steps that are performed after the step shown in FIG. 5(c).

FIGS. 7(a) to 7(b) show a series of principal manufacturing steps that are performed after the step shown in FIG. 6(c).

FIGS. 11(a) to 11(b) show a series of principal manufacturing steps.

FIGS. 13(a) to 13(b) show a series of principal manufacturing steps.

FIG. 14 shows a principal manufacturing step performed after the step shown in FIG. 13(b).

DETAILED DESCRIPTION OF EMBODIMENTS

Preferable embodiments of a semiconductor device, an active matrix substrate, and a display device of the present invention will be described below with reference to figures. In the description below, an example where the present invention is applied to a switching element for a pixel electrode used for an active matrix substrate will be explained. Dimensions of components in the respective figures do not accurately represent dimensions of actual components, dimensional ratios of the respective components, and the like.

Embodiment 1

Figure 1:
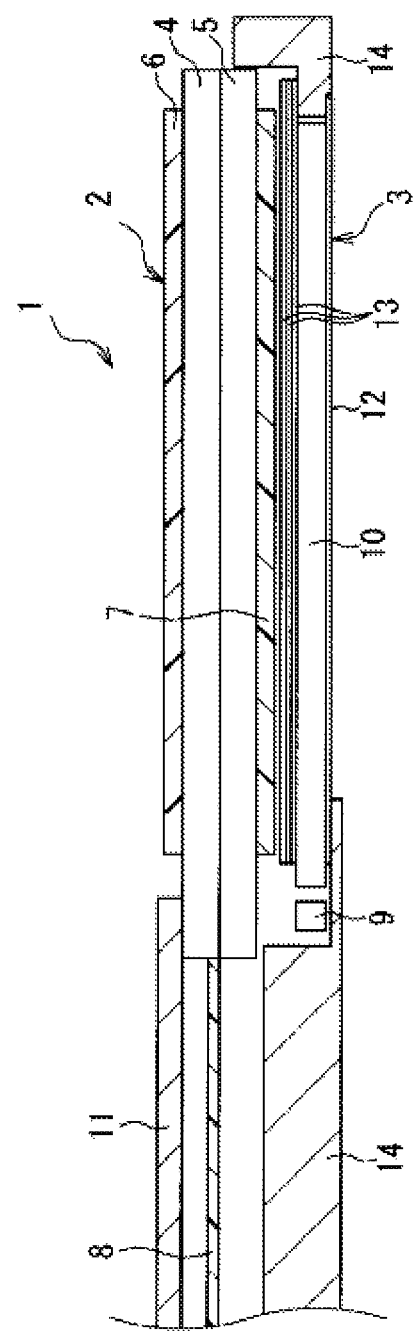
FIG. 1 is a figure for explaining a liquid crystal display device according to Embodiment 1 of the present invention.

FIG. 1 is a figure for explaining a liquid crystal display device according to Embodiment 1 of the present invention. In FIG. 1, a liquid crystal display device 1 of this embodiment is provided with a liquid crystal panel 2 and a backlight device 3. The liquid crystal panel 2 is arranged such that the upper side in FIG. 1 becomes a viewer's side (a display surface side). The backlight device 3 is disposed on a non-display surface side of the liquid crystal panel 2 (lower side in FIG. 1), and generates illuminating light that illuminates the liquid crystal panel 2.

The liquid crystal panel 2 is provided with a color filter substrate 4 and an active matrix substrate 5 constituting a pair of substrates, and polarizing plates 6 and 7 that are arranged on outer surfaces of the color filter substrate 4 and the active matrix substrate 5, respectively. A liquid crystal layer (not shown) is held between the color filter substrate 4 and the active matrix substrate 5. For the color filter substrate 4 and the active matrix substrate 5, plate-like transparent glass materials or transparent synthetic resins such as acrylic resin are used. For the polarizing plates 6 and 7, resin films such as TAC (triacetylcellulose) or PVA (polyvinyl alcohol) are used. The polarizing plates 6 and 7 are bonded to the corresponding color filter substrate 4 and active matrix substrate 5 so as to cover at least an effective display region of the display surface disposed on the liquid crystal panel 2.

The active matrix substrate 5 is one of the pair of substrates, and in the active matrix substrate 5, pixel electrodes, thin-film transistors (TFTs), and the like are formed between the liquid crystal layer and the substrate so as to correspond to a plurality of pixels included in the display surface of the liquid crystal panel 2 (will be described in detail below). In the active matrix substrate 5, switching elements (semiconductor devices) of the present invention including the thin-film transistors are provided for the respective pixels as described in detail below. On the other hand, in the color filter substrate 4, which is the other substrate of the pair of substrates, a color filter, an opposite electrode, and the like are formed between the liquid crystal layer (not shown) and the substrate.

The liquid crystal panel 2 also includes an FPC (Flexible Printed Circuit) 8 that is connected to a control device (not shown) that drives and controls the liquid crystal panel 2, and is configured such that, by activating the liquid crystal layer pixel by pixel, and by driving the display surface pixel by pixel, a desired image is displayed on the display surface.

Here, a liquid crystal mode and a pixel structure of the liquid crystal panel 2 can be appropriately selected. A drive mode of the liquid crystal panel 2 can also be appropriately selected. In other words, any liquid crystal panels that can display information can be used as the liquid crystal panel 2. Therefore, the detailed structure of the liquid crystal panel 2 is not shown in FIG. 1 and a description thereof is omitted.

The backlight device 3 is provided with a light-emitting diode 9 as a light source and a light guide plate 10 disposed so as to face the light-emitting diode 9. In the backlight device 3, the light-emitting diode 9 and the light guide plate 10 are held by a bezel 14, which has an L-shaped cross section, with the liquid crystal panel 2 being disposed above the light guide plate 10. Also, a case 11 is placed on the color filter substrate 4. This way, the backlight device 3 is attached to the liquid crystal panel 2, and the two components are held in a unified manner as a transmissive liquid crystal display device 1 in which the illuminating light from the backlight device 3 enters the liquid crystal panel 2.

The light guide plate 10 is made of a transparent synthetic resin such as an acrylic resin, for example, and receives light from the light-emitting diode 9. A reflective sheet 12 is arranged on the light guide plate 10 on the side (the opposite surface side) opposite to the liquid crystal panel 2, and optical sheets 13 such as a lens sheet and a diffusion sheet are arranged on the light guide plate 10 on the side close to the liquid crystal panel 2 (the light-emitting surface side). This way, the light from the light-emitting diode 9 that is guided through the light guide plate 10 in a prescribed light guide direction (the direction from the left side to the right side in FIG. 1) is converted into planar illuminating light with a uniform luminance, and is emitted to the liquid crystal panel 2.

In the above-mentioned description, the configuration of using the edge-light type backlight device 3 having the light guide plate 10 was described. However, the present embodiment is not limited to this, and a direct lighting backlight device may also be used. Also, it is possible to use a backlight device having other types of light source such as a cold cathode fluorescent lamp and a hot cathode fluorescent lamp, instead of the light-emitting diode.

Figure 2:
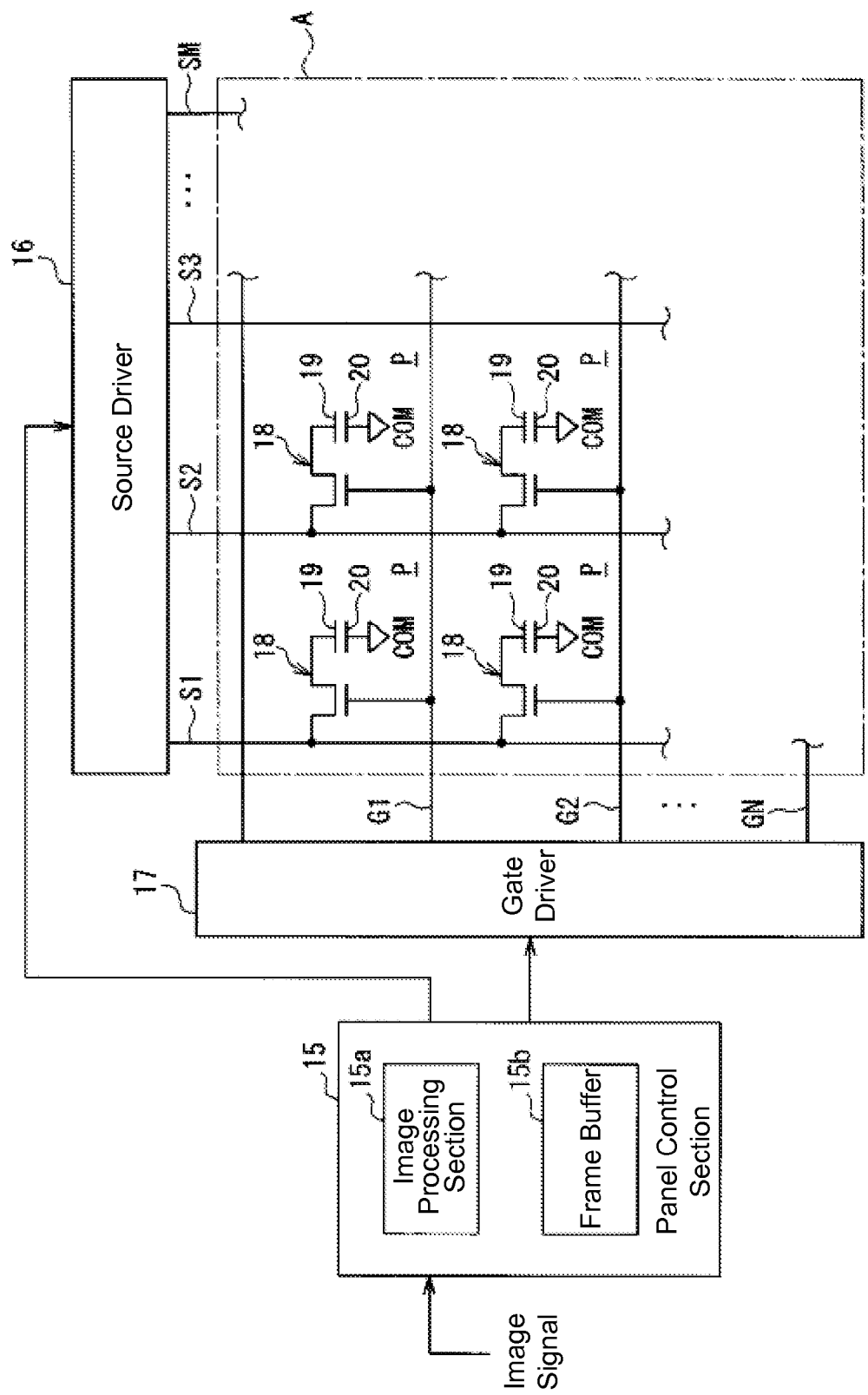
FIG. 2 is a figure for explaining a configuration of a liquid crystal panel shown in FIG. 1.

Next, the liquid crystal panel 2 of the present embodiment will be specifically described referring to FIG. 2.

FIG. 2 is a figure for explaining a configuration of the liquid crystal panel shown in FIG. 1.

In FIG. 2, the liquid crystal display device 1 (FIG. 1) is provided with a panel control unit 15, a source driver 16, and a gate driver 17. The panel control unit 15 drives and controls the liquid crystal panel 2 (FIG. 1), which is a display section where the information such as letters and images are displayed. The source driver 16 and the gate driver 17 are driven in accordance with instruction signals from the panel control unit 15.

The panel control unit 15 is provided in the control device, and receives an image signal from the outside of the liquid crystal display device 1. The panel control unit 15 is provided with an image processing unit 15a and a frame buffer 15b. The image processing unit 15a performs a prescribed image processing on a received image signal, and generates instruction signals that are to be sent to the source driver 16 and the gate driver 17, respectively. The frame buffer 15b can store the display data for one frame included in the received image signal. The panel control unit 15 drives and controls the source driver 16 and the gate driver 17 in accordance with the received image signal, thereby displaying the information corresponding to the image signal on the liquid crystal panel 2.

The source driver 16 and the gate driver 17 are disposed on the active matrix substrate 5. Specifically, on the surface of the active matrix substrate 5, the source driver 16 is arranged along the horizontal direction of the liquid crystal panel 2 in a region outside of an effective display region A of the liquid crystal panel 2 as the display panel. The gate driver 17 is arranged along the vertical direction of the liquid crystal panel 2 in a region outside of the effective display region A on the surface of the active matrix substrate 5.

The source driver 16 and the gate driver 17 are driver circuits that individually drive each of a plurality of pixels P provided in the liquid crystal panel 2. To the source driver 16 and the gate driver 17, a plurality of source wiring lines S1 to SM (M is an integer of 2 or greater; hereinafter collectively referred to as "S") and a plurality of gate wiring lines G1 to GN (N is an integer of 2 or greater; hereinafter collectively referred to as "G") are connected, respectively. These source wiring lines S and gate wiring lines G respectively constitute the data wiring lines and the scan wiring lines, and are arranged in a matrix so as to intersect with each other on a transparent glass material or a transparent synthetic resin base material (not shown) in the active matrix substrate 5. In other words, the source wiring lines S are arranged on the base material so as to be parallel to the column direction of the matrix (vertical direction of the liquid crystal panel 2), and the gate wiring lines G are arranged on the base material so as to be parallel to the row direction of the matrix (horizontal direction of the liquid crystal panel 2).

The gate wiring lines G constitute first signal wiring lines, and supply a gate signal that controls a potential of the top gate electrodes of the switching elements, which will be described later.

Near the respective intersections of these source wiring lines S and gate wiring lines G, the pixels P are provided. The pixels P respectively include switching elements 18 for pixel electrodes, in which the semiconductor devices of the present invention are employed, and the pixel electrodes 19 that are connected to the switching elements 18. The respective pixels P are configured such that the respective pixel electrodes 19 face a common electrode 20 through the liquid crystal layer provided in the liquid crystal panel 2. In other words, in the active matrix substrate 5, each pixel includes the switching element 18, the pixel electrode 19, and the common electrode 20.

In the active matrix substrate 5, respective plurality of pixels P are formed in respective regions that are divided by the source wiring lines S and the gate wiring lines G and that are thereby arranged in a matrix. The plurality of pixels P includes pixels of red (R), green (G), and blue (B). These RGB pixels are sequentially arranged in this order, for example, in parallel with the respective gate wiring lines G1 to GN. These RGB pixels can display the corresponding colors by a color filter layer (not shown) disposed in the color filter substrate 4.

In the active matrix substrate 5, the gate driver 17 sequentially outputs a scan signal (a gate signal) to the gate wiring lines G1 to GN in accordance with the instruction signal from the image processing unit 15a. The scan signal turns on the gate electrodes and the top gate electrodes of the corresponding switching elements 18. The source driver 16 outputs data signals (voltage signals (gradation voltages)), which correspond to the brightness (gradation) of the display image, to the corresponding source wiring lines S1 to SM in accordance with the instruction signal from the image processing unit 15a.

Figure 3:
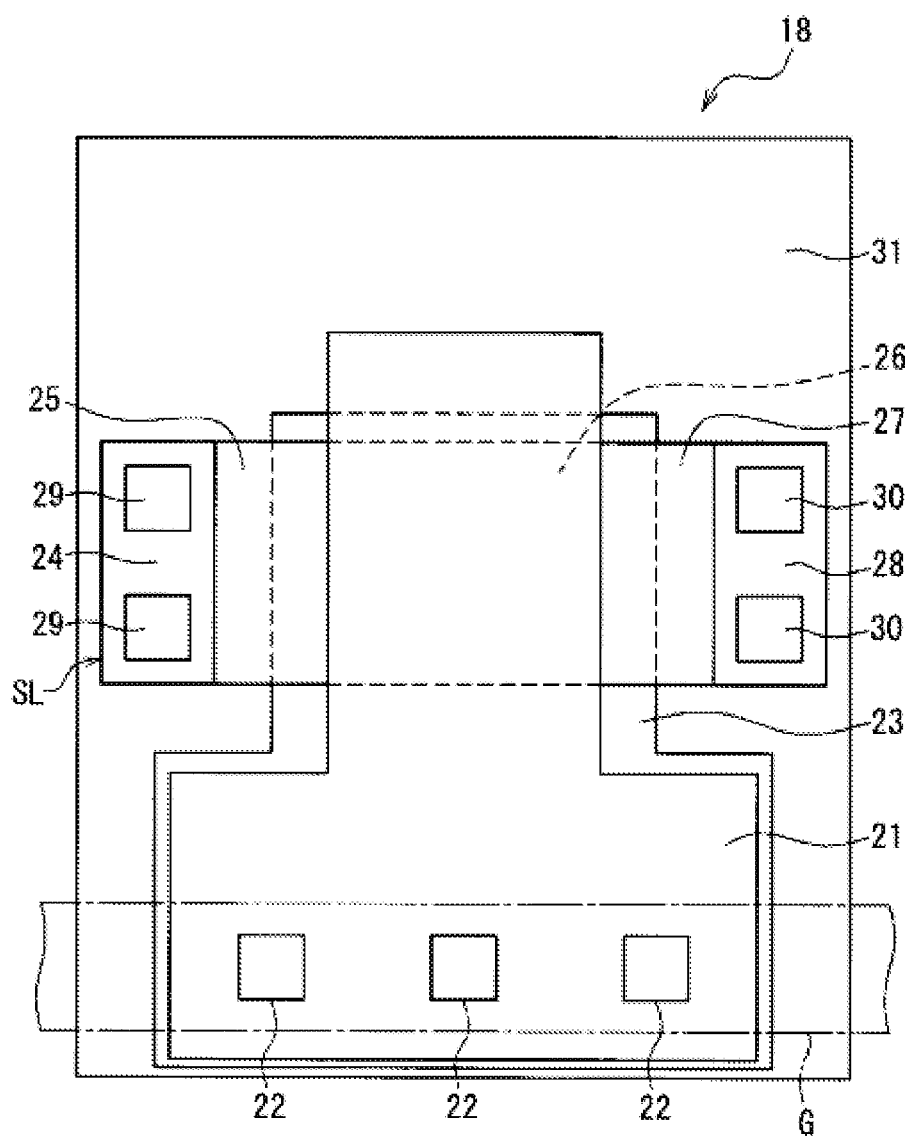
FIG. 3 is a plan view showing a configuration of a principal portion of a switching element shown in FIG. 2.
Figure 4:
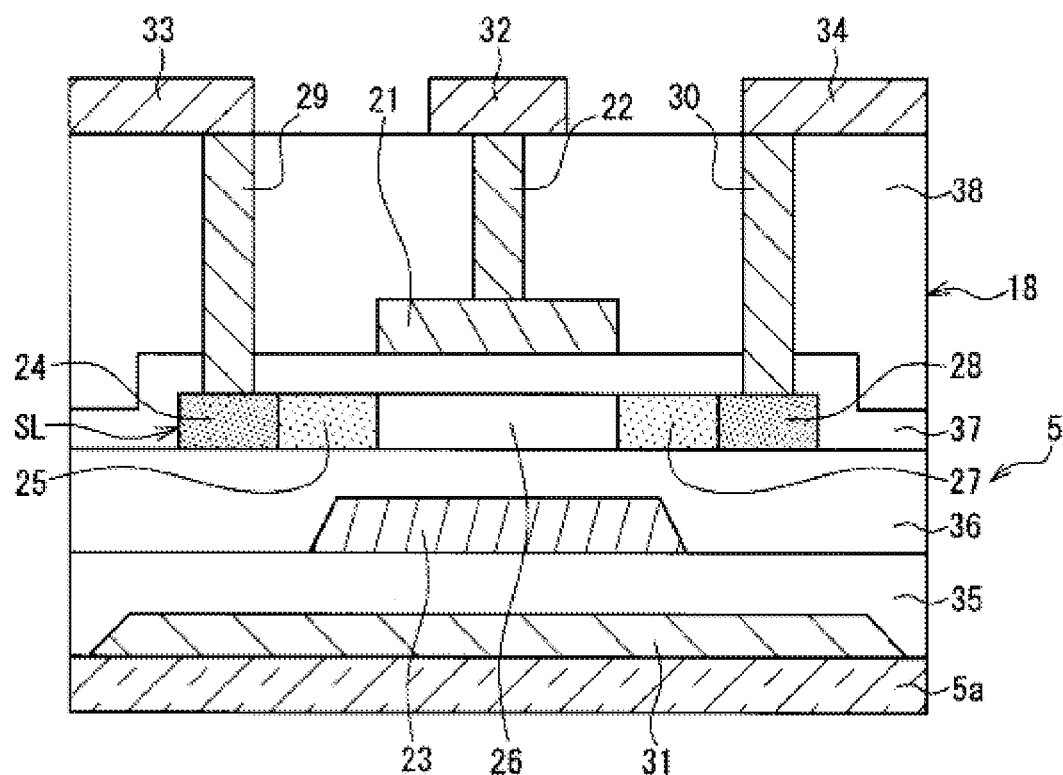
FIG. 4 is a cross-sectional view showing a specific configuration of the switching element.

Next, the switching elements 18 of the present embodiment will be specifically described referring to FIGS. 3 and 4.

FIG. 3 is a plan view showing a principal configuration of the switching element shown in FIG. 2. FIG. 4 is a cross-sectional view showing a specific configuration of the switching element.

As illustrated in FIG. 3, the switching element 18 is provided with a top gate electrode 21 formed in a projected shape, a silicon layer SL as a semiconductor layer disposed under the top gate electrode 21, a bottom gate electrode 23 formed in a projected shape disposed under the silicon layer SL, and a light-shielding film 31 disposed under the bottom gate electrode 23. In other words, the switching element 18 is a double-gate structured thin-film transistor that has the top gate electrode 21 and the bottom gate electrode 23.

In the switching element 18, the top gate electrode 21 and the bottom gate electrode 23 are arranged so as to overlap each other in a vertical direction (thickness direction of the active matrix substrate 5), and these top gate electrode 21 and bottom gate electrode 23 are capacitively-coupled. The switching element 18 is configured such that, in respective states of an ON state and an OFF state thereof, when the voltage is applied to the gate wiring line G and the potential of the top gate electrode 21 is thereby controlled, the potential of the bottom gate electrode 23 is set to an optimal prescribed potential by the capacitance coupling with the top gate electrode 21 (which will be later described in detail).

The bottom gate electrode 23 is made of a metal material. Also, as described in detail below, the bottom gate electrode 23 is arranged so as to overlap the channel region and depletion layer regions formed in the low-concentration impurity regions (LDD (Lightly Doped Drain) regions) in the silicon layer SL. The bottom gate electrode 23 is configured such that when the optimal potential is applied to it in the ON state, the ON current (current driving force) of the switching element 18 is increased, and such that when the optimal potential is applied to it in the OFF state, the (OFF) leak current of the switching element 18 is reduced.

The light-shielding film 31 is disposed below the bottom gate electrode 23 so as to overlap at least the entire silicon layer SL. The light-shielding film 31 shields the light entering from the bottom side of the switching element 18 such as the illuminating light from the backlight device 3, for example.

As shown in FIG. 4, in the active matrix substrate 5, one switching element 18 is provided on a base substrate 5a made of a glass substrate, for example, so as to correspond to each pixel. In other words, in the switching element 18, the light-shielding film 31 is formed on the base substrate 5a, and an interlayer insulating film 35 is formed to cover the light-shielding film 31. Further, in the switching element 18, the bottom gate electrode 23 is formed on the interlayer insulating film 35, and a base coat film 36 is formed to cover the bottom gate electrode 23. Instead of the example described above, the base substrate 5a can be made of a quartz substrate or a plastic substrate.

Further, in the switching element 18, the silicon layer SL is formed on the base coat film 36, and a gate insulating film 37 is formed to cover the silicon layer SL. In the silicon layer SL, a source region 24, a (first) low-concentration impurity region 25, a channel region 26, a (second) low-concentration impurity region 27, and a drain region 28 are formed along the horizontal direction in FIG. 4. An n-type transistor is used for the switching element 18, for example. Therefore, in the silicon layer SL, the source region 24 and the drain region 28 are constituted of high concentration regions (shown in FIG. 4 with crosshatches) into which an n-type impurity such as phosphorus was implanted at high concentration, and the low-concentration impurity regions 25 and 27 are constituted of regions (shown in FIG. 4 with dots) into which an n-type impurity was implanted at low concentration. The channel region 26 is constituted of a region into which a p-type impurity such as boron was implanted.

Instead of the example described above, the switching element 18 may be constituted of a p-type transistor. When the p-type transistor is used, the source region 24, the low-concentration impurity regions 25 and 27, and the drain region 28 are constituted of regions into which a p-type impurity was implanted, and the channel region 26 is constituted of a region into which an n-type impurity was implanted.

Instead of the example described above, the low-concentration impurity regions 25 and 27 may be constituted of regions into which a p-type impurity was implanted at the same concentration as that of the channel region 26. In other words, the low-concentration impurity regions 25 and 27 and the channel region 26 may be offset regions with the p-type impurity doped therein.

In the switching element 18, as shown in FIG. 4, the bottom gate electrode 23 is arranged so as to overlap the channel region 26 and the depletion layer regions formed in the low-concentration impurity regions 25 and 27 in the silicon layer SL. The depleting layer regions are formed in a part of low-concentration impurity region 25, which is adjacent to the source region 24, and a part of low-concentration impurity region 27, which is adjacent to the drain region 28. In detail, in the bottom gate electrode 23 formed in a projected shape, one end of the projected portion is positioned below the part of the low-concentration impurity region 25 adjacent to the source region 24, and the other end of the projected portion is positioned below the part of the low-concentration impurity region 27 adjacent to the drain region 28.

In the switching element 18, the top gate electrode 21 is formed on the gate insulating film 37 at a position directly above the channel region 26, and an interlayer insulating film 38 is formed to cover the top gate electrode 21. In the switching element 18, the top gate electrode 21 is connected to the gate wiring line G (FIG. 3) via contact holes 22 and the gate electrode 32 formed on the interlayer insulating film 38. The source region 24 is connected to a source electrode 33 via a contact hole 29, and the drain region 28 is connected to a drain electrode 34 via a contact hole 30. The source electrode 33 and the drain electrode 34 are connected to the source wiring line S (FIG. 2) and to the pixel electrode 19 (FIG. 2), respectively.

Instead of the example described above, the switching element 18 may have a configuration in which the gate electrode 32 is not provided, and the gate wiring line G is formed of the same conductive layer as the top gate electrode 21.

In the switching element 18, as described above, the potential of the top gate electrode 21 is controlled by the gate signal from the gate wiring line G, and the potential of the bottom gate electrode 23 is controlled by the capacitance coupling with the top gate electrode 21.

In the bottom gate electrode 23, the potential of the bottom gate electrode 23 is controlled such the channel region 26 goes into accumulation when the switching element (the transistor) 18 is turned off. This makes it possible to reliably reduce the leak current in the switching element 18.

On the other hand, when the switching element 18 is turned on, in the bottom gate electrode 23, the potential of the bottom gate electrode 23 is controlled such that the channel region 26 goes into inversion from depletion. This makes it possible to reliably increase the ON current in the switching element 18.

The optimal prescribed potentials of the bottom gate electrode 23 in the on state and in the off state of the switching element 18, respectively, are appropriately selected based on the impurity concentration in the channel region 26, the impurity concentration in the low-concentration impurity regions 25 and 27, the potential at the drain electrode 34, the potential at the top gate electrode 21 (voltage applied to the gate wiring lines G), the characteristics and the thickness of the base coat film 36, the capacitance coupling ratio at a portion where the top gate electrode 21 and the bottom gate electrode 23 are capacitively coupled, and the like.

Below, a method of manufacturing the switching element 18 of the present embodiment will be specifically described referring to FIGS. 5 to 7.

Figure 5:
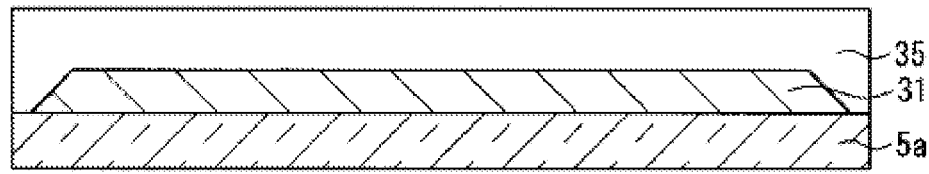
FIG. 5 is a figure for explaining a process of manufacturing the switching element.
Figure 5:
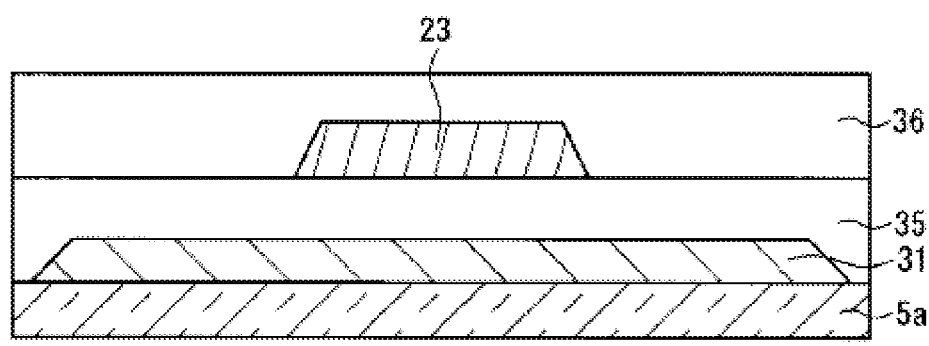
Figure 5:
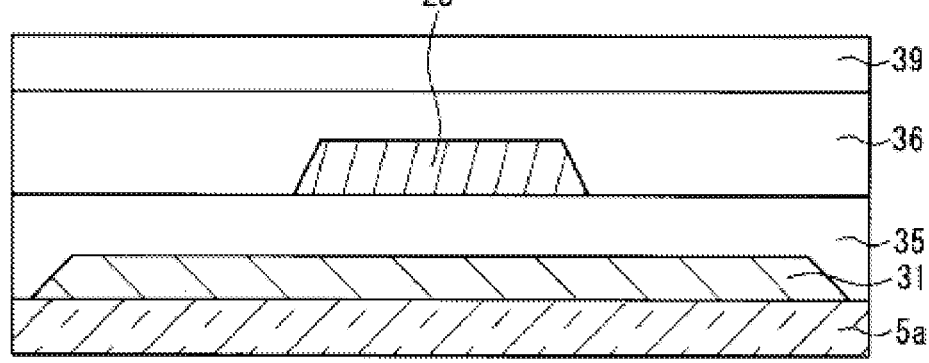

FIG. 5 is a figure for explaining a process of manufacturing the switching element, and FIGS. 5(a) to 5(c) show a series of the principal manufacturing steps. FIG. 6 is a figure for explaining a process of manufacturing the switching element, and FIGS. 6(a) to 6(c) show a series of the principal manufacturing steps performed after the step shown in FIG. 5(c). FIG. 7 is a figure for explaining a process of manufacturing the switching element, and FIGS. 7(a) to 7(b) show a series of the principal manufacturing steps performed after the step shown in FIG. 6(c).

As shown in FIG. 5(a), in the switching element 18, the light-shielding film 31 is formed on the base substrate 5a first. The light-shielding film 31 is arranged so as to cover the entire silicon layer SL constituted of the channel region 26, the source region 24, and the drain region 28, which will be formed in subsequent steps. For the light-shielding film 31, a conductive film formed by laminating a TaN film and a W film is used, for example.

Instead of the example described above, the light-shielding film 31 may be formed of an element chosen from Ta, W, Ti, Mo, Al, Cu, Cr, Nd, and the like, or an alloy material or a compound material that is mainly made of those elements. Alternatively, the light-shielding film 31 may be formed of a semiconductor film such as polycrystalline silicon with an impurity such as phosphorus or boron doped therein.

It is preferable that the light-shielding film 31 have a forward tapered shape at its ends as illustrated in FIG. 5(a) so as to make it possible to form the silicon layer SL, which will be formed in a subsequent step, as flat as possible.

Next, as shown in FIG. 5(a), the interlayer insulating film 35 is formed to cover the entire surface of the light-shielding film 31 and the base substrate 5a. The interlayer insulating film 35 can be formed by using a film made of an insulating inorganic substance such as a silicon oxide film, a silicon nitride film, or a silicon oxide film, or a laminated film formed by appropriately combining these films. In the switching element 18 of the present embodiment, a silicon oxide film is used. The interlayer insulating film 35 can be formed by depositing a film by the LPCVD method, the plasma CVD method, the sputtering method, or the like. The thickness of the interlayer insulating film 35 is determined so as to be best suited for the need to form the silicon layer SL as flat as possible, and specifically, it is set to about 100 to 500 nm.

Next, as shown in FIG. 5(b), the bottom gate electrode 23 is formed on the interlayer insulating film 35. The bottom gate electrode 23 is arranged so as to cover the channel region 26, a part of the low-concentration impurity region 25, which is adjacent to the source region 24, and a part of low-concentration impurity region 27, which is adjacent to the drain region 28, in the silicon layer SL, which will be formed in subsequent steps. For the bottom gate electrode 23, a conductive film formed by laminating a TaN film and a W film is used, for example.

Instead of the example described above, the bottom gate electrode 23 may be formed of an element chosen from Ta, W, Ti, Mo, Al, Cu, Cr, Nd, and the like, or an alloy material or a compound material mainly made of these elements. Alternatively, the bottom gate electrode 23 may be formed of a semiconductor film such as polycrystalline silicon with an impurity such as phosphorus or boron doped therein.

It is preferable that the bottom gate electrode 23 have a forward tapered shape at its ends as illustrated in FIG. 5(*b*) so as to make it possible to form the silicon layer SL, which will be formed in a subsequent step, as flat as possible.

In terms of optimal design dimensions of the position of the bottom gate electrode 23, the bottom gate electrode 23 needs to be placed so as to cover the entire rear surface of the P-type channel region 26 so that the ON current can be reliably increased by the channel region 26. Also, in order to eliminate or minimize regions where the bottom gate electrode 23 overlaps the respective high-concentration impurity regions, i.e., the source region 24 and of the drain region 28, so as to reduce the OFF leak current, it is necessary to define the dimensions taking into account variability in the process. Specifically, in case of the 1.5 μm rule process, for example, the design overlap amount with the respective low-concentration impurity regions 25 and 27 (i.e., the design overlapping amount of the bottom gate electrode 23 with respect to the top gate electrode 21) becomes optimal when it is set to 0.75 to 2.5 μm. This value, however, needs to be suitably modified for the width of the low-concentration impurity regions 25 and 27, the impurity concentration thereof, the characteristics and the thickness of the base coat film 36, the process to be used, and the like.

Next, as shown in FIG. 5(*b*), the base coat film 36 is formed to cover the entire surface of the bottom gate electrode 23 and the base substrate 5*a*. The base coat film 36 can be formed by using a film made of an insulating inorganic substance such as a silicon oxide film, a silicon nitride film, or a silicon nitride oxide film, or a laminated film formed by appropriately combining these films. In the switching element 18 of the present embodiment, a silicon oxide film is used. The base coat film 36 can be formed by depositing a film by the LPCVD method, the plasma CVD method, the sputtering method, or the like. The thickness of the base coat film 36 needs to be set to an appropriate thickness suited for forming the silicon layer SL as flat as possible and for obtaining the electric field effect from the bottom gate electrode 23, and specifically, it is set to about 100 to 500 nm.

Next, as shown in FIG. 5(*c*), a non-single-crystal semiconductor thin film 39 is formed to cover the entire surface of the base coat film 36. The non-single-crystal semiconductor thin film 39 is formed by the LPCVD method, the plasma CVD method, the sputtering method, or the like. For the non-single-crystal semiconductor thin film 39, amorphous silicon, polycrystalline silicon, amorphous germanium, polycrystalline germanium, amorphous silicon germanium, polycrystalline silicon germanium, amorphous silicon carbide, polycrystalline silicon carbide, or the like can be used. In the switching element 18 of the present invention, amorphous silicon is used for the non-single-crystal semiconductor thin film 39. The thickness of the non-single-crystal semiconductor thin film 39 is in relation to the characteristics of the switching elements (thin-film transistors), and is set to about 30 to 80 nm, for example.

Thereafter, by radiating a laser beam, an electron beam, or the like to the non-single-crystal semiconductor thin film 39, the non-single crystal semiconductor thin film 39 is crystallized, thereby turning into a polycrystalline semiconductor thin film.

Figure 6:
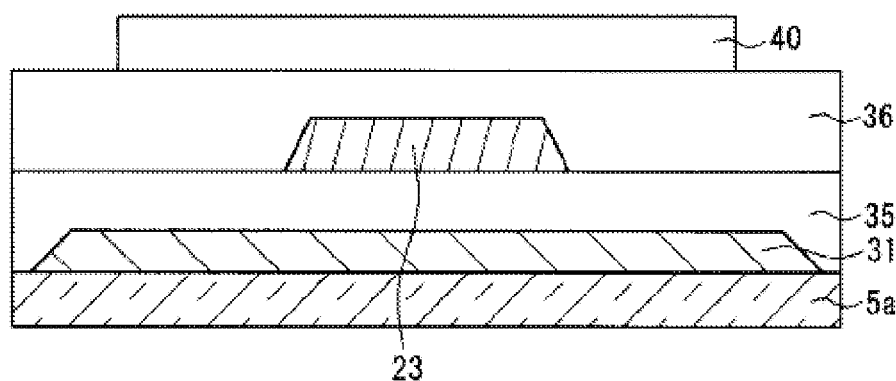
FIG. 6 is a figure for explaining a process of manufacturing the switching element.
Figure 6:
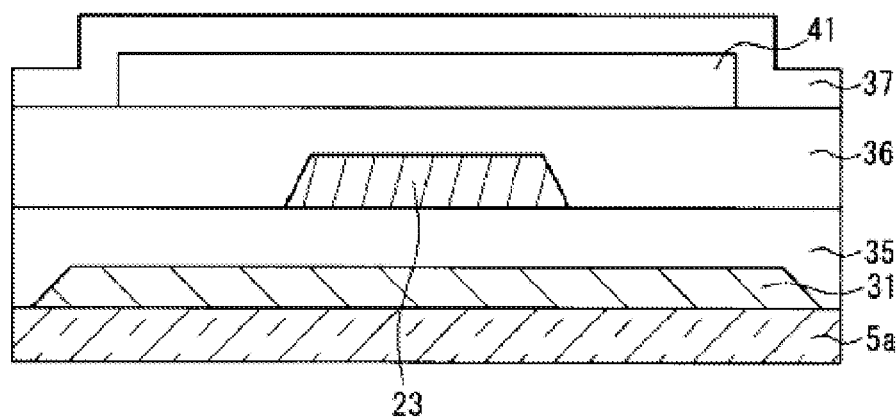
Figure 6:
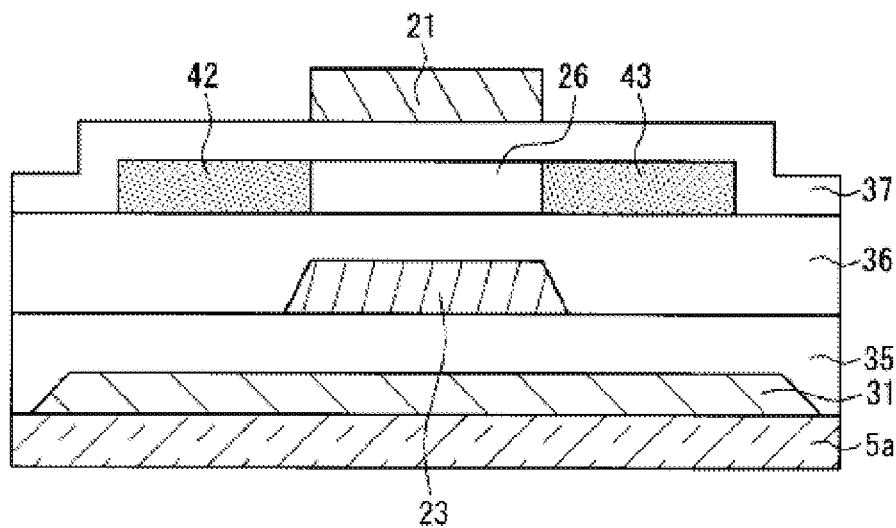

Next, as shown in FIG. 6(*a*), by photolithography, the polycrystalline semiconductor thin film 40 is patterned so as to correspond to the region where the bottom gate electrode 23 is formed.

Next, as shown in FIG. 6(*b*), the gate insulating film 37 is formed to cover the entire surfaces of the polycrystalline semiconductor thin film 40 and the base coat film 36. The gate insulating film 37 is constituted of an inorganic insulating film such as a silicon oxide film and a silicon nitride film, or a laminated film of those films. The thickness of the gate insulating film 37 is set to about 30 to 80 nm, for example. Thereafter, doping with a p-type impurity such as boron is performed from above the gate insulating film 37, thereby forming a p-type channel region 41.

Next, as shown in FIG. 6(*c*), the top gate electrode 21 is formed on the gate insulating film 37. As the top gate electrode 21, a conductive film formed by laminating a TaN film and a W film is used, for example. Specifically, after the conductive film is formed on the gate insulating film 37, a resist pattern is formed by photolithography, and by using the resist pattern as a mask, the conductive film is etched and patterned, thereby forming the top gate electrode 21 on the gate insulating film 37. The thickness of the top gate electrode 21 is set to about 200 to 600 nm, for example.

Instead of the example described above, the top gate electrode 21 may be formed of an element chosen from Ta, W, Ti, Mo, Al, Cu, Cr, Nd, and the like, or an alloy material or a compound material mainly made of these elements. Alternatively, the top gate electrode 21 may be formed of a semiconductor film such as a polycrystalline silicon film with an impurity such as phosphorus or boron doped therein.

Thereafter, as shown in FIG. 6(*c*), doping with an n-type impurity such as phosphorus or arsenic at a relatively low concentration is performed from above the gate insulating film 37 such that n-type low-concentration impurity regions are self-aligned to the top gate electrode 21. This way, n-type low-concentration impurity regions 42 and 43 are formed so as to sandwich the p-type channel region 26.

Figure 7:
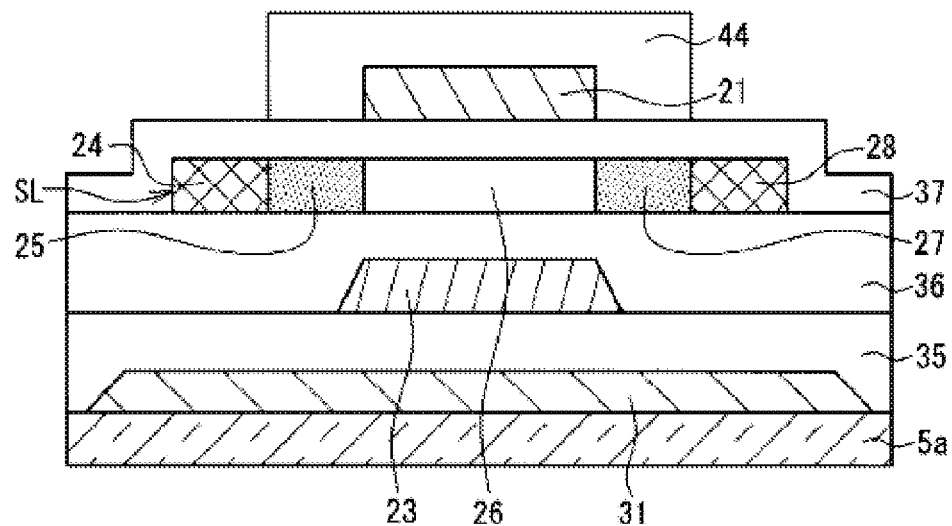
FIG. 7 is a figure for explaining a process of manufacturing the switching element.
Figure 7:
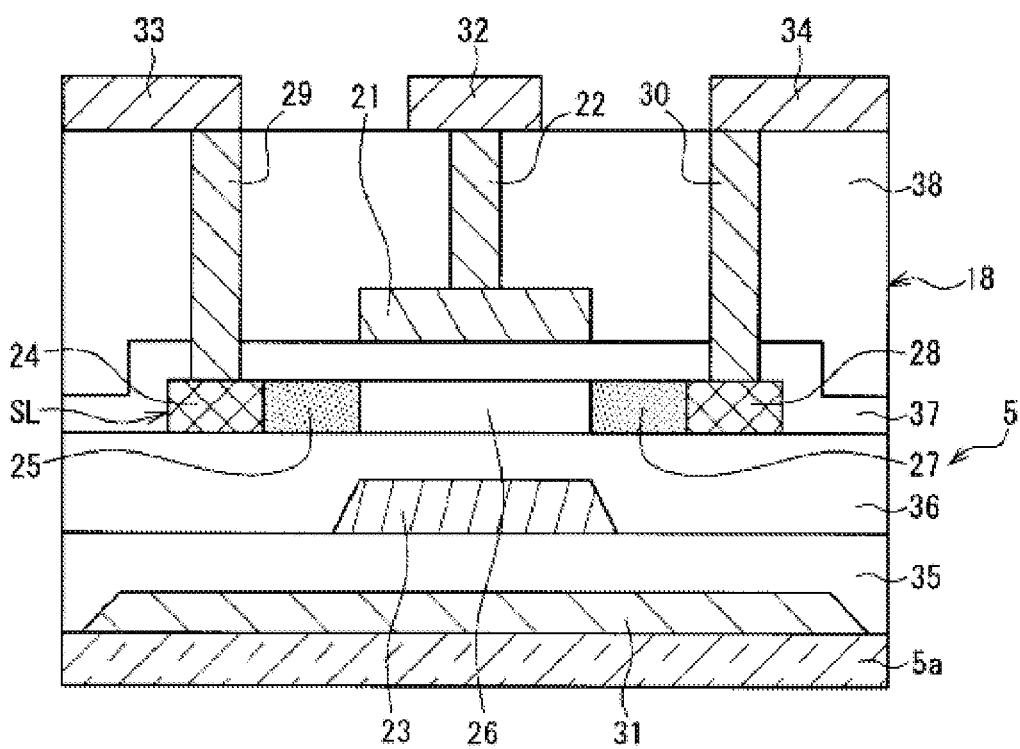

Next, as shown in FIG. 7(*a*), a photoresist 44 is formed on the gate insulating film 37. Thereafter, doping with an n-type impurity such as phosphorus or arsenic is performed from above the gate insulating film 37, thereby forming the source region 24, the low-concentration impurity regions 25 and 27, and the drain region 28.

In the low-concentration impurity regions 25 and 27, the width dimension thereof needs to be determined so as to ensure sufficient margins to account for process variability in the alignment (of the photoresist 44) and to account for process variability in the alignment of the bottom gate electrode 23 as described above. Specifically, in the case of the 1.5 μm rule process, for example, the optimal width dimension for the respective low-concentration impurity regions 25 and 27 is about 1.0 to 4.0 μm. In this case, in the impurity ion implantation for forming the low-concentration impurity regions 25 and 27, $P^+$ ions or As ions are implanted with a dose of 0.1 to $4.0 \times 10^{13}/cm^2$. This dose, however, needs to be suitably modified for the required characteristics for the switching element 18 and the process conditions.

Next, as shown in FIG. 7(*b*), the interlayer insulating film 38 is formed to cover the entire surfaces of the top gate electrode 21 and the gate insulating film 37. The interlayer insulating film 38 is constituted of an inorganic insulating film such as a silicon oxide film and a silicon nitride film, or a laminated film made of those films. The thickness of the interlayer insulating film 38 is set to about 500 to 1500 nm, for example.

Next, as shown in FIG. 7(b), contact holes 29 and 30 that penetrate the gate insulating film 37 and the interlayer insulating film 38 are respectively formed on the source region 24 and the drain region 28. A contact hole 22 that penetrates the interlayer insulating film 37 is formed on the top gate electrode 21. Thereafter, a conductive film is formed on the interlayer insulating film 38 by the sputtering method or the like. For this conductive film, a conductive film made of aluminum or the like can be used, for example, but the conductive film is not limited to such. The conductive film may also be formed of an element chosen from Ta, W, Ti, Mo, Al, Cu, Cr, Nd, and the like, or an alloy material or a compound material mainly made of these elements. Alternatively, the conductive film may be a laminated film formed by appropriately combining those materials as needed. In the switching element 18 of the present embodiment, aluminum is used.

Lastly, as shown in FIG. 7(b), the conductive film is etched and patterned into a desired shape by photolithography, thereby forming the gate electrode 32, the source electrode 33, and the drain electrode 34 on the interlayer insulating film 38. The thicknesses of the gate electrode 32, the source electrode 33, and the drain electrode 34 are respectively set to about 250 to 800 nm, for example.

In the switching element (the semiconductor device) 18 of the present embodiment configured in the manner described above, the silicon layer (the semiconductor layer) SL provided with the source region 24, the drain region 28, the channel region 26, and the low-concentration impurity regions 25 and 27 is disposed between the top gate electrode 21 and the bottom gate electrode 23. Also, in the switching element 18 of the present embodiment, the bottom gate electrode 23 is arranged so as to overlap the channel region 26, a part of the low-concentration impurity region 25, which is adjacent to the source region 24, and a part of the low-concentration impurity region 27, which is adjacent to the drain region 28. Further, in the switching element 18 of the present embodiment, the potential of the bottom gate electrode 23 is controlled to be a prescribed potential. As a result, unlike the above-mentioned conventional example, in the switching element 18 of the present embodiment, even when the ON current is increased, the leak current can be reduced.

Figure 8:
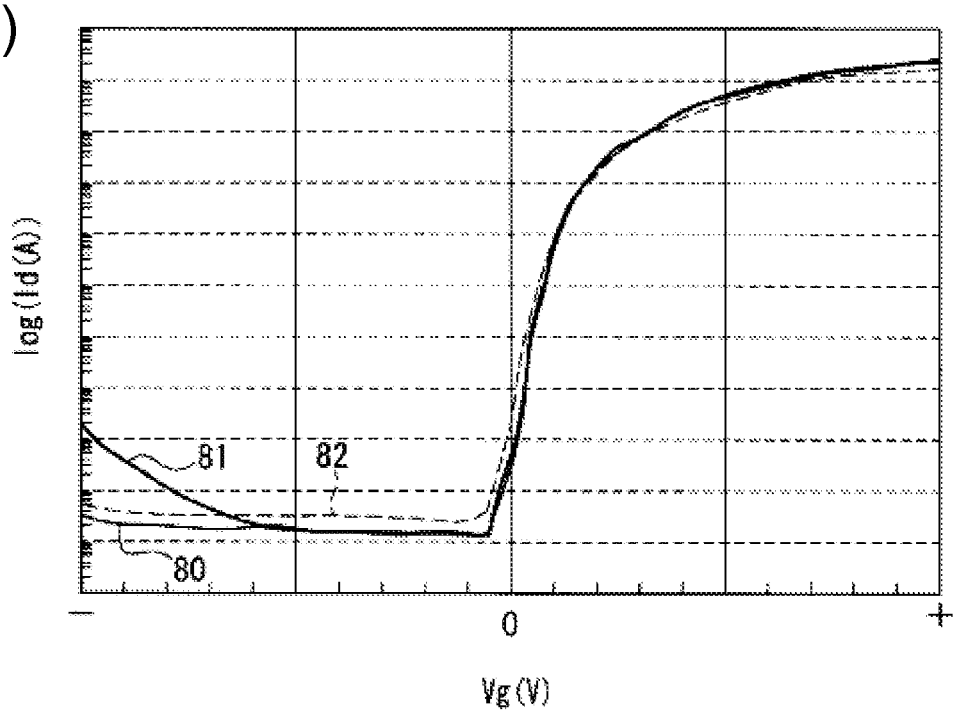
FIG. 8(a) is a graph showing the switching characteristics of a product according to Embodiment 1, a conventional product, and a comparative product.
FIG. 8(b) is a graph showing the ON characteristics of the product according to Embodiment 1, the conventional product, and the comparative product.
Figure 8:
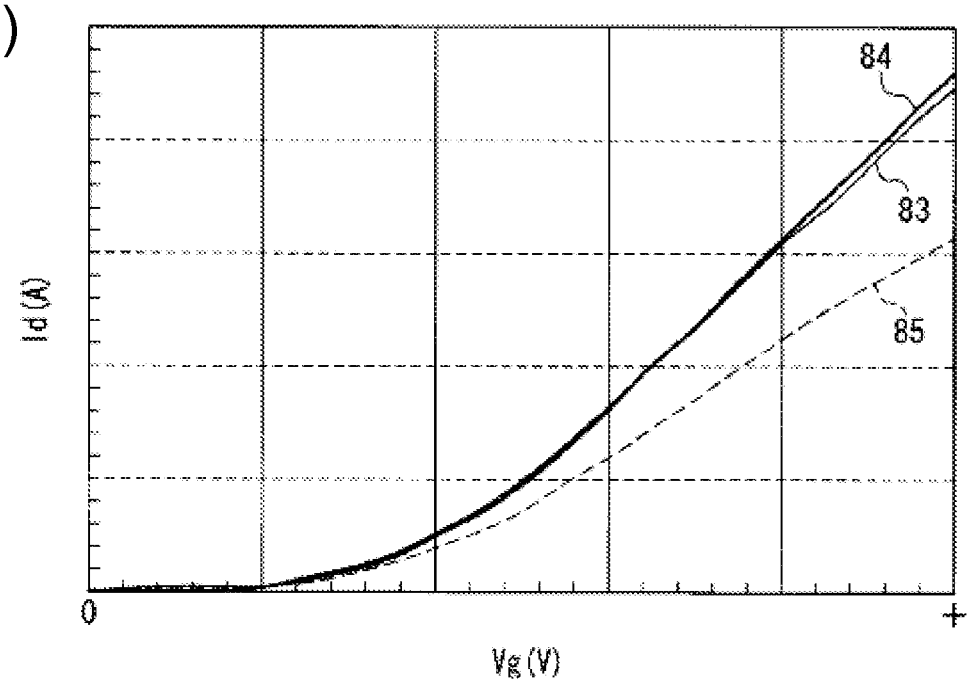
Figure 9:
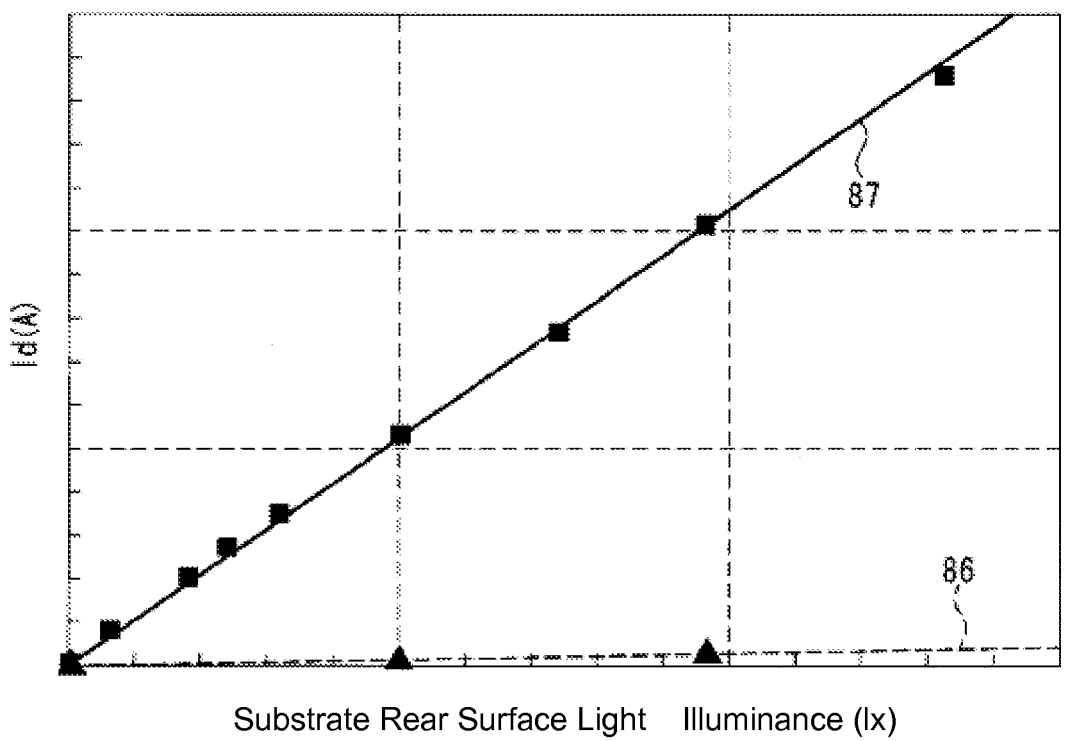
FIG. 9 is a graph showing a relationship between the illuminance and the leak current of the product of Embodiment 1 and the comparative product.

Here, the above-mentioned effects of the switching element 18 of this embodiment will be specifically described referring to FIGS. 8 and 9.

FIG. 8(a) is a graph showing the switching characteristics of a product of this embodiment, a conventional product, and a comparative product. FIG. 8(b) is a graph showing the on-state characteristics of the product of this embodiment, the conventional product, and the comparative product. FIG. 9 is a graph showing the relationship between the illuminance and the leak current of the product of this embodiment and the comparative product.

In order to verify the above-mentioned effects of the switching element 18 of the present embodiment, the inventors of the present invention prepared the product of the present embodiment and the conventional product that corresponds to the above-mentioned conventional example, and measured the actual ON current and the leak current of these devices. One example of the verification test results is shown in FIGS. 8(a) and 8(b). For the comparative product shown in FIGS. 8(a) and 8(b), a switching element without a bottom gate electrode was prepared, and the actual ON current and the leak current of the comparative product were measured.

In the product of the present embodiment, when the top gate voltage is 0V or less, in other words, when the switching element 18 is turned off, the potential of the bottom gate electrode 23 is set to the optimal potential for the off state of the switching element 18 by the capacitance coupling with the top gate electrode 21 as described above. Thus, in the product of this embodiment, as shown in FIG. 8(a) with the thin line 80, it was verified that the drain current, i.e., the leak current, is reduced as compared with the conventional product shown in FIG. 8(a) with the bold line 81. In other words, it was confirmed that the vertical (thickness direction of the active matrix substrate 5) electric field is lowered and the leak current is therefore reduced in the product of the present embodiment as compared with the conventional product in which the bottom gate electrode thereof formed a GOLD structure. It was also confirmed that the leak current is reduced in the product of the present embodiment as compared to the comparative product shown in FIG. 8(a) with the dotted line 82.

In the product of the present embodiment, when the top gate voltage is more than 0V, in other words, when the switching element 18 is turned on, the potential of the bottom gate electrode 23 is set to the optimal potential for the ON state of the switching element 18 by the capacitance coupling with the top gate electrode 21 as described above. Therefore, as shown in FIG. 8(b) with the thin line 83, it was verified that the substantially same drain current, i.e., ON current, as that of the conventional product shown in FIG. 8(b) with the bold line 84 can be obtained in the product of the present embodiment. It was also verified that the ON current is substantially increased in the product of the present embodiment as compared with the comparative product shown in FIG. 8(b) with the dotted line 85.

Further, in order to verify the effects of the bottom gate electrode 23 in the switching element 18 of the present embodiment, the inventors of the present invention prepared the product of the present embodiment and the comparative product, and obtained a relationship between illuminance of light incident on the rear surface of the active matrix substrate 5 and the (OFF) leak current. One example of the verification test results is shown in FIG. 9.

In the product of the present embodiment, as shown in FIG. 9 with the dotted line 86, it was verified that when the switching element 18 was turned off, even if the illuminance of the light incident on the rear surface was increased, little leak current flowed. On the other hand, in the comparative product, as shown in FIG. 9 with the solid line 87, it was verified that the leak current is increased with the increase in the illuminance of the light incident on the rear surface.

In this embodiment, the potential of the top gate electrode 21 is controlled by a gate signal from the gate wiring line (first signal wiring line) G to which the top gate electrode 21 is connected, and the potential of the bottom gate electrode 23 is controlled by the capacitance coupling with the top gate electrode 21. Therefore, in this embodiment, signal wiring lines and the like for applying a prescribed potential to the bottom gate electrode 23 can be omitted, and the switching element 18 with a simple structure can be configured with ease.

In this embodiment, the potential of the bottom gate electrode 23 is controlled such that, when the switching element 18 is turned off, the channel region 26 goes into accumulation, and the potential of the bottom gate electrode 23 is controlled such that, when the switching element 18 is turned on, the channel region 26 goes into inversion from depletion. Therefore, in the switching element 18 of the present embodiment, the ON current can be reliably increased, and the leak current can be reliably reduced.

In this embodiment, the switching element (semiconductor device) 18 in which the leak current can be reduced even when the ON current is increased is employed, and therefore, the active matrix substrate 5 and the liquid crystal display device (display device) 1 with high performance and low power consumption can be configured with ease.

Embodiment 2

Figure 10:
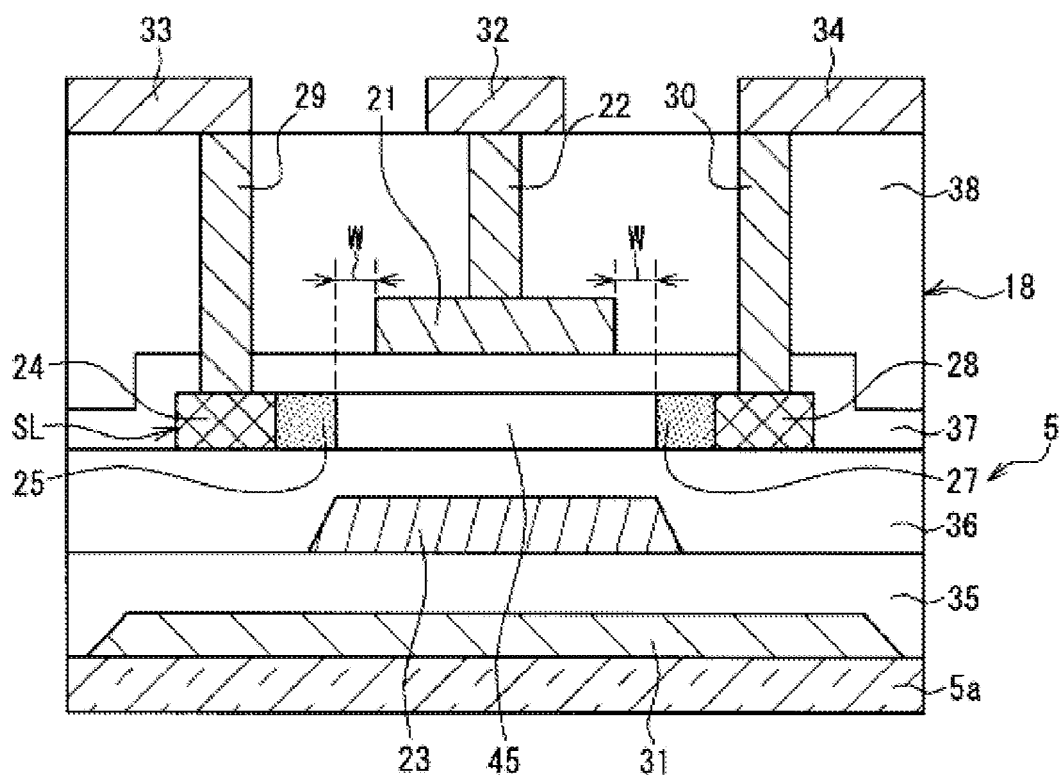
FIG. 10 is a cross-sectional view showing a specific configuration of a switching element according to Embodiment 2 of the present invention.

FIG. 10 is a cross-sectional view showing a specific configuration of a switching element according to Embodiment 2 of the present invention. As shown in the figure, the present embodiment mainly differs from Embodiment 1 in that the low-concentration impurity regions are formed such that they sandwich the channel region and are offset from the top gate electrode in the silicon layer. The same reference characters are given to the same elements as those in Embodiment 1, and explanations thereof will not be repeated.

As shown in FIG. 10, in the switching element 18 of the present embodiment, the low-concentration impurity regions 25 and 27 are formed so as to sandwich the channel region 45 and so as to be offset from the top gate electrode 21 in the silicon layer (the semiconductor layer) SL. Specifically, as shown in FIG. 10 with "W," the offset structure is formed in the portions that are not directly under the top gate electrode 21.

Figure 11:
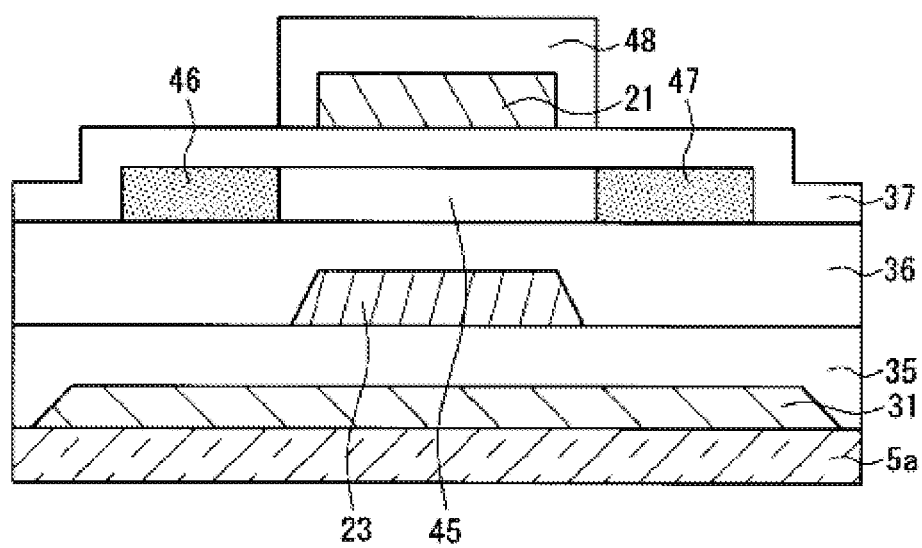
FIG. 11 is a figure for explaining a process of manufacturing the switching element shown in FIG. 10.
Figure 11:
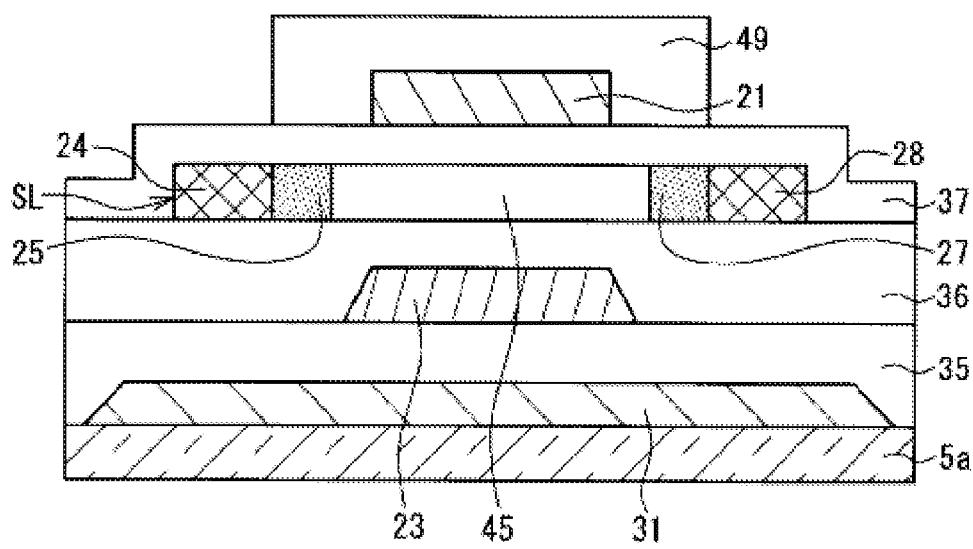

A method of manufacturing the switching element 18 of this embodiment will be specifically described referring to FIG. 11. In the description below, the steps that are different from those of Embodiment 1 will be mainly described so as to simplify the explanation. Specifically, the impurity profiles of the channel region, the source region, and the drain region are the only differences from Embodiment 1.

FIG. 11 is a figure for explaining steps of manufacturing the switching element shown in FIG. 10. FIGS. 11(a) to 11(b) show a series of the principal manufacturing steps.

As shown in FIG. 11(a), in the switching element 18 of the present embodiment, the top gate electrode 21 is formed on the gate insulating film 37 in a manner similar to FIG. 6(c). For the top gate electrode 21, a conductive film formed by laminating a TaN film and a W film is used, for example. Specifically, after the conductive film is formed on the gate insulating film 37, a resist pattern is formed by photolithography, and by using the resist pattern as a mask, the conductive film is etched and patterned, thereby forming the top gate electrode 21 on the gate insulating film 37. The thickness of the top gate electrode 21 is set to about 200 to 600 nm, for example.

Instead of the example described above, the top gate electrode 21 may be formed of an element chosen from Ta, W, Ti, Mo, Al, Cu, Cr, Nd, and the like, or using an alloy material or an compound material mainly made of these elements. Alternatively, the top gate electrode 21 may be formed of a semiconductor film such as polycrystalline silicon with an impurity such as phosphorus or boron doped therein.

Thereafter, as shown in FIG. 11(a), a photoresist 48 is formed on the top gate electrode 21, and doping with an n-type impurity such as phosphorus or arsenic at a relatively low concentration is performed from above the gate insulating film 37. This way, n-type low-concentration impurity regions 46 and 47 are formed so as to sandwich the p-type channel region 45 and so as to be offset from the top gate electrode 21.

Next, as shown in FIG. 11(b), a photoresist 49 is formed on the gate insulating film 37 so as to cover the n-type low-concentration impurity regions 25 and 27. Thereafter, doping with an n-type impurity such as phosphorus or arsenic at a relatively low concentration is performed from above the gate insulating film 37, thereby forming the source region 24 and the drain region 28.

According to the configuration described above, the same effects and functions as those of Embodiment 1 can be obtained in this embodiment. Also, in this embodiment, the low-concentration impurity regions 25 and 27 are formed so as to sandwich the channel region 45 and so as to be offset from the top gate electrode 21 in the silicon layer (semiconductor layer) SL. This makes it possible to lower the electric field in the silicon layer SL (electric field in the cross direction (the horizontal direction in FIG. 10)), and therefore, in the present embodiment, the leak current can be further reduced.

Embodiment 3

Figure 12:
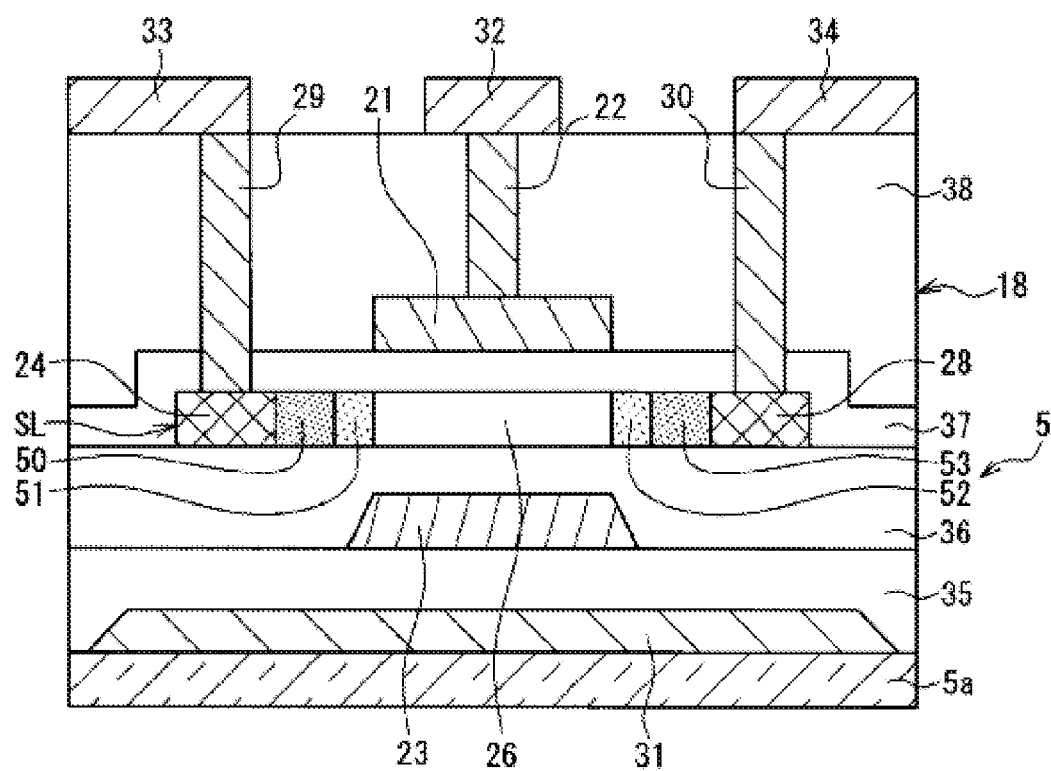
FIG. 12 is a cross-sectional view showing a specific configuration of a switching element according to Embodiment 3 of the present invention.

FIG. 12 is a cross-sectional view showing a specific configuration of a switching element according to Embodiment 3 of the present invention. As shown in the figure, the present embodiment mainly differs from Embodiment 1 in that a plurality of kinds of low-concentration impurity regions having different impurity concentrations are provided as the low-concentration impurity regions. The same reference characters are given to the same elements as those of Embodiment 1, and explanations thereof will not be repeated.

As shown in FIG. 12, in the switching element 18 of this embodiment, (third and fourth) low-concentration impurity regions 50 and 51 that have different impurity concentrations from each other are provided in a (first) low-concentration impurity region, which is arranged between the source region 24 and the channel region 26. Similarly, (third and fourth) low-concentration impurity regions 52 and 53 that have different impurity concentrations from each other are provided in a (second) low-concentration impurity region, which is arranged between the drain region 28 and the channel region 26. The low-concentration impurity region 50 and the low-concentration impurity region 53 have the same impurity concentration, and the low-concentration impurity region 51 and the low-concentration impurity region 52 have the same impurity concentration.

Figure 13:
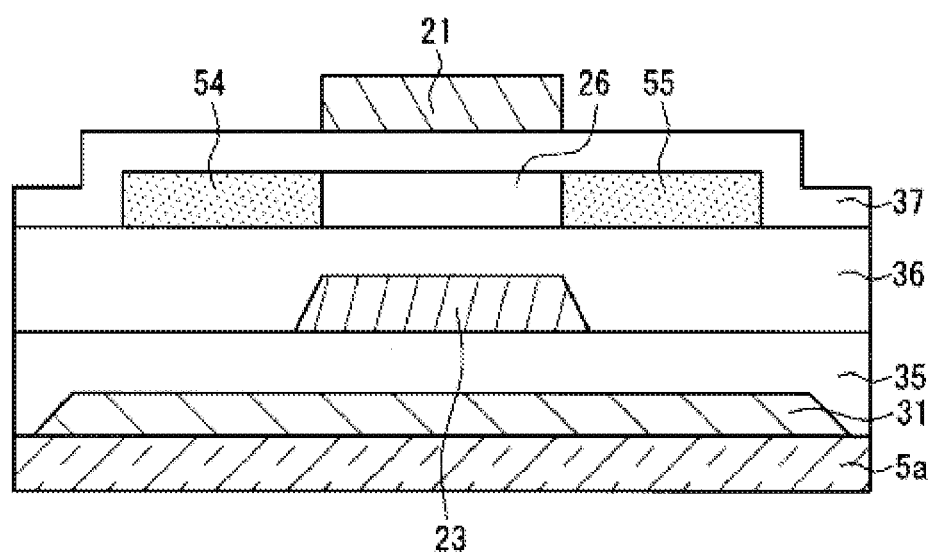
FIG. 13 is a figure for explaining a process of manufacturing the switching element shown in FIG. 12.
Figure 13:
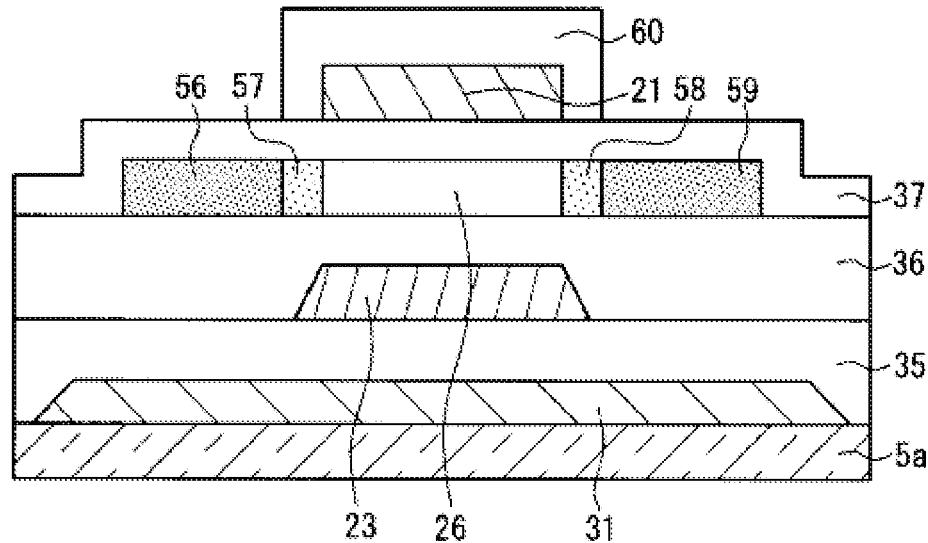
Figure 14:
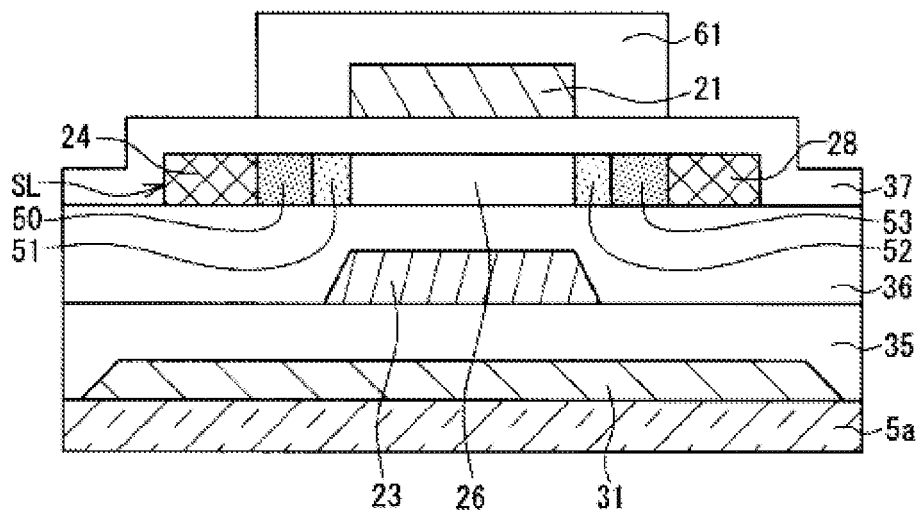
FIG. 14 is a figure for explaining a process of manufacturing the switching element shown in FIG. 12.

A method of manufacturing the switching element 18 of this embodiment will be specifically described referring to FIGS. 13 and 14. In the description below, the steps that are different from those of Embodiment 1 will be mainly described so as to simplify the explanation. Specifically, the impurity profiles of the channel region, the source region, and the drain region are the only differences from Embodiment 1.

FIG. 13 is a figure for explaining steps of manufacturing the switching element shown in FIG. 12, and FIGS. 13(a) to 13(b) show a series of the principal manufacturing steps. FIG. 14 is a figure for explaining a step of manufacturing the switching element shown in FIG. 12, and FIG. 14 shows the principal manufacturing step performed after the step shown in FIG. 13(b).

As shown in FIG. 13(a), in the switching element 18 of this embodiment, the top gate electrode 21 is formed on the gate insulating film 37 in a manner similar to FIG. 6(c). For the top gate electrode 21, a conductive film formed by laminating a TaN film and a W film is used, for example. Specifically, after the conductive film is formed on the gate insulating film 37, a resist pattern is formed by photolithography, and by using the resist pattern as a mask, the conductive film is etched and patterned, thereby forming the top gate electrode 21 on the gate insulating film 37. The thickness of the top gate electrode 21 is set to about 200 to 600 nm, for example.

Instead of the example described above, the top gate electrode 21 may be formed of an element chosen from Ta, W, Ti, Mo, Al, Cu, Cr, Nd, and the like, or using an alloy material or a compound material mainly made of these elements. Alternatively, the top gate electrode 21 may be formed of a semiconductor film such as polycrystalline silicon with an impurity such as phosphorus or boron doped therein.

Thereafter, as shown in FIG. 13(a), doping with an n-type impurity such as phosphorus or arsenic at a relatively low concentration is performed from above the gate insulating film 37 such that n-type low-concentration impurity regions are self-aligned to the top gate electrode 21. This way, n-type low-concentration impurity regions 54 and 55 are formed so as to sandwich the p-type channel region 26.

Next, as shown in FIG. 13(b), a photoresist 60 is formed on the top gate electrode 21, and by performing doping with an n-type impurity such as phosphorus or arsenic at a relatively low concentration from above the gate insulating film 37, n-type low-concentration impurity regions 56 and 59 are formed so as to sandwich the p-type channel region 26. Below the photoresist 60, low-concentration impurity regions 57 and 58 that have the same impurity concentration as that of the low-concentration impurity regions 54 and 55 shown in FIG. 13(a) are formed. The n-type impurity concentration of the low-concentration impurity regions 57 and 58 is set to be lower than that of the low-concentration impurity regions 56 and 59.

Next, as shown in FIG. 14, a photoresist 61 is formed on the gate insulating film 37 so as to cover the n-type low-concentration impurity regions 50 to 53 that have the two concentration levels, and thereafter, by performing doping with the n-type impurity such as phosphorus or arsenic from above the gate insulating film 37, the source region 24 and the drain region 28 are formed.

Figure 15:
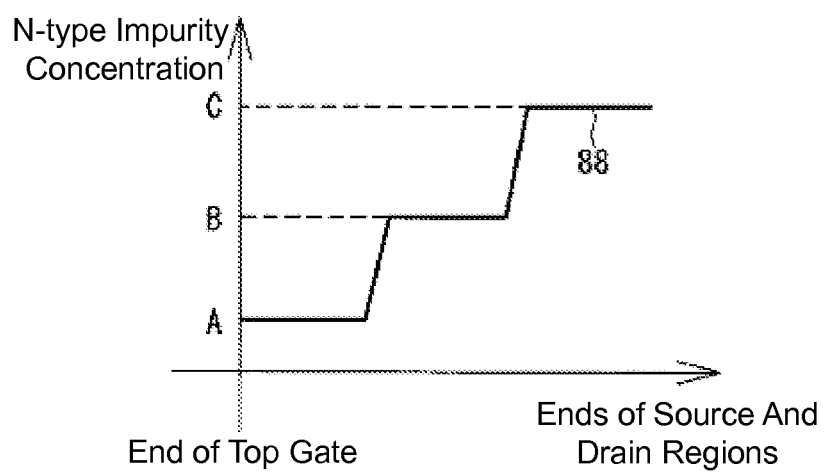
FIG. 15(a) is a graph showing a specific impurity concentration profile in low-concentration impurity regions of the switching element shown in FIG. 12.
FIG. 15(b) is a graph showing another specific impurity concentration profile in the low-concentration impurity regions of the switching element shown in FIG. 12.
Figure 15:
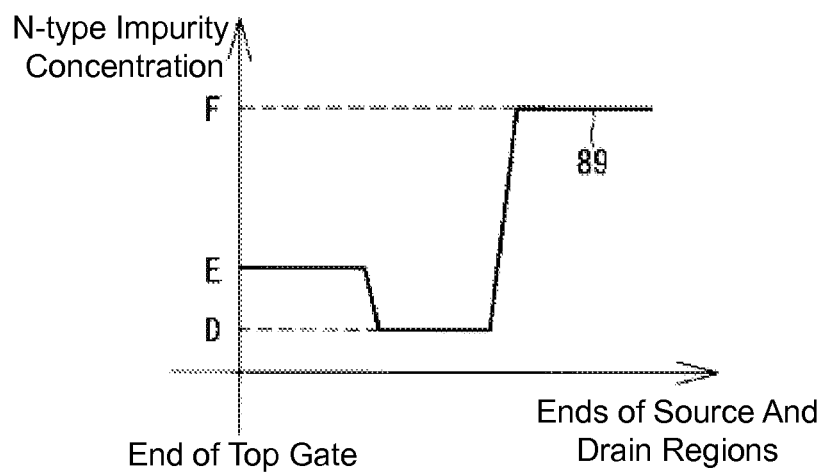

The specific impurity concentration profiles of the source region 24, the low-concentration impurity regions 50 to 53, and the drain region 28 of the switching element 18 in this embodiment will be described below with reference to FIG. 15.

FIG. 15(a) is a graph showing the specific impurity concentration profile of the low-concentration impurity regions in the switching element shown in FIG. 12. FIG. 15(b) is a graph showing another specific impurity concentration profile of the low-concentration impurity regions in the switching element shown in FIG. 12.

As shown in FIG. 15(a) with the solid line 88, the n-type impurity concentration of the low-concentration impurity regions 51 and 52 is set to A. The n-type impurity concentration of the low-concentration impurity regions 50 and 53 is set to B. The n-type impurity concentration of the source region 24 and the drain region 28 is set to C. Here, specific values of A and B are $5 \times 10^{16}$ to $1 \times 10^{18}$ ions/cm$^3$, for example. A specific value of C is $5 \times 10^{19}$ to $1 \times 10^{21}$ ions/cm$^3$, for example.

Instead of the example described above, as shown in FIG. 15(b) with the solid line 89, for example, the n-type impurity concentration of the low-concentration impurity regions 51 and 52 may be set to E. The n-type impurity concentration of the low-concentration impurity regions 50 and 53 may be set to D. The n-type impurity concentration of the source region 24 and the drain region 28 may be set to F. In other words, the impurity concentration in the low-concentration impurity regions adjacent to the channel region 26 may be higher than the impurity concentration in the low-concentration impurity regions adjacent to the source region 24 and the drain region 28. Further, the low-concentration impurity regions with impurity concentrations of three or more different levels may be arranged between the source region 24 and the channel region 26, and between the drain region 28 and the channel region 26, respectively.

According to the configurations described above, the same effects and functions as those of Embodiment 1 can be obtained in the present embodiment. Also, in these embodiments, because plural low-concentration impurity regions 50 to 53 having different impurity concentrations are formed, the electric field in the silicon layer SL (electric field in the cross direction (horizontal direction in FIG. 12)) can be lowered, which can further reduce the leak current.

In addition to the examples described above, Embodiments 2 and 3 may be combined.

Embodiment 4

Figure 16:
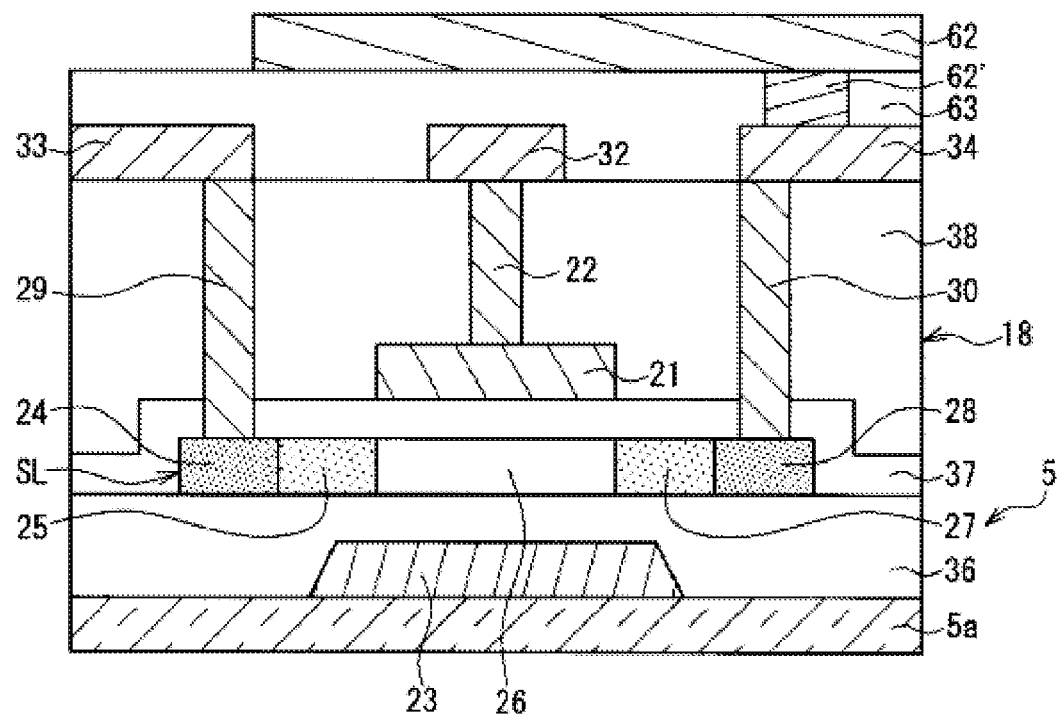
FIG. 16 is a cross-sectional view showing a specific configuration of a switching element according to Embodiment 4 of the present invention.

FIG. 16 is a cross-sectional view showing a specific configuration of a switching element according to Embodiment 4 of the present invention. As shown in the figure, this embodiment mainly differs from Embodiment 1 in that a reflective electrode is provided above the top gate electrode so as to be used for a reflective liquid crystal display device. The same reference characters are given to the same elements as those of Embodiment 1, and explanations thereof will not be repeated.

As shown in FIG. 16, in the switching element 18 of this embodiment, a reflective electrode 62 is disposed above the top gate electrode 21, the gate electrode 32, the source electrode 33, and the drain electrode 34. An organic planarizing film 63 is disposed between the reflective electrode 62 and the gate electrode 32, the source electrode 33, and the drain electrode 34. The reflective electrode 62 is electrically connected only to the drain electrode 34 via a contact hole 62' that goes through the organic planarizing film 63. By having this reflective electrode 62, a liquid crystal display device of the present embodiment is formed as a reflective liquid crystal display device.

In this embodiment, the backlight device 3 is not provided below the base substrate 5a, unlike the above-mentioned embodiments. Thus, the switching element 18 of the present embodiment is not provided with the light-shielding film on the base substrate 5a. In the switching element 18 of this embodiment, the bottom gate electrode 23 is arranged so as to overlap the channel region 26, a part of the low-concentration impurity region 25, which is adjacent to the source region 24, and a part of the low-concentration impurity region 27, which is adjacent to the drain region 28, in a manner similar to the embodiments above.

According to the configuration described above, the same effects and results as those of Embodiment 1 can be obtained in the present embodiment. Also, in the present embodiment, because the reflective electrode 62 is provided above the top gate electrode 21, the switching element 18 that can be used for the reflective liquid crystal display device can be configured with ease.

Embodiment 5

Figure 17:
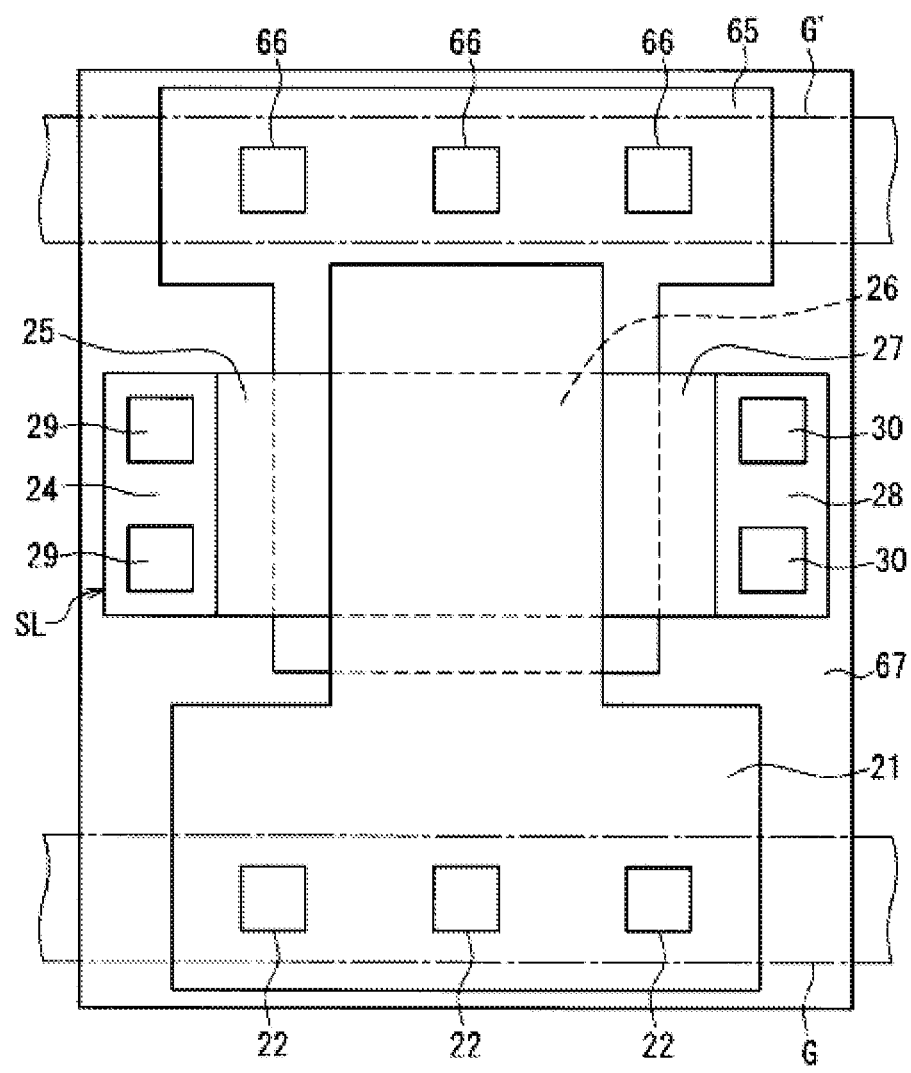
FIG. 17 is a plan view showing a principal configuration of a switching element according to Embodiment 5 of the present invention.

FIG. 17 is a plan view showing a principal configuration of a switching element according to Embodiment 5 of the present invention. As shown in the figure, the present embodiment mainly differs from Embodiment 1 in that a bottom gate wiring line (second signal wiring line) is connected to the bottom gate electrode, and the potential of the bottom gate electrode is controlled by a bottom gate signal from the bottom gate wiring line. The same reference characters are given to the same elements as those of Embodiment 1, and explanations thereof will not be repeated.

As shown in FIG. 17, in the switching element 18, a bottom gate electrode 65 formed in a projected shape and the top gate electrode 21 formed in a projected shape are arranged so as to face each other in the vertical direction in FIG. 17. Unlike the bottom gate electrode in Embodiment 1, this bottom gate electrode 65 is arranged to have a minimal overlapping area with the top gate electrode 21 in the vertical direction (the direction of the thickness of the active matrix substrate 5) so that these bottom gate electrode 65 and top gate electrode 21 are not capacitively-coupled.

The bottom gate wiring line G' as the second signal wiring line is connected to the bottom gate electrode 65 via a contact hole 66. The bottom gate wiring G' is arranged so as to be parallel to the gate wiring line G, and is connected to the gate driver 17 in the same manner as the gate wiring line G. In the switching element 18 of this embodiment, the bottom gate signal (voltage applied) to the bottom gate wiring line G' is controlled such that the bottom gate electrode 65 has prescribed optimal potentials in the on state and in the off state of the switching element, respectively, in the same manner as Embodiment 1.

Instead of the examples described above where the gate wiring line G and the bottom gate wiring line G' are provided, the gate wiring line G may be formed of the same conductive layer as that forms the top gate electrode 21, and the bottom gate wiring line G' may be formed of the same conductive layer as that forms the bottom gate electrode 65.

In the switching element 18 of this embodiment, a light-shielding film 67 is provided below the bottom gate electrode 65. In the manner similar to that of Embodiment 1, the light-shielding film 67 is arranged below the bottom gate electrode 65 so as to cover at least the entire silicon layer SL, and the light-shielding film 67 shields the light entering from the bottom side of the switching element 18 such as the illuminating light from the backlight device 3.

According to the configuration described above, the same effects and functions as those of Embodiment 1 can be achieved in this embodiment. Also, in this embodiment, because the potential of the bottom gate electrode 65 is controlled by the bottom gate signal from the bottom gate wiring line (second signal wiring line) G', which is connected to the bottom gate electrode 65, the potential of the bottom gate electrode 65 can be controlled with a higher degree of freedom. This makes it easier to achieve the increase in the ON current and the reduction in the leak current.

All of the above-mentioned embodiments are illustrative and not limiting. The technical scope of the present invention is defined by the claims, and any modifications within a scope that is equivalent to the configurations stated therein are included in the technical scope of the present invention.

In the above-mentioned descriptions, an example in which the present invention was applied to a switching element for the pixel electrode used for the active matrix substrate in the liquid crystal display device has been explained. However, there is no special limitation on the semiconductor device of the present invention as long as it includes: a semiconductor layer that is disposed between the top gate electrode and the bottom gate electrode and that has the source region, the drain region, the channel region, and the low-concentration impurity regions; and the bottom gate electrode that is disposed so as to overlap the channel region, a part of the low-concentration impurity region, which is adjacent to the source region, and a part of the low-concentration impurity region, which is adjacent to the drain region and that is controlled to have a prescribed potential. Specifically, the present invention can be applied to various display devices such as a transflective liquid crystal panel, a reflective liquid crystal panel, an organic EL (Electronic Luminescence) element, an inorganic EL element, or a field emission display, an active matrix substrate used for those various display devices, and the like, for example. The semiconductor device of the present invention can be applied not only to the switching element for the pixel electrode, but also to the switching element and the like for the peripheral circuits such as a driver circuit.

In the description of Embodiments 1 to 3 and 5, the configuration in which the light-shielding film is arranged below the bottom gate electrode was described, but the present invention is not limited to such. Even when the present invention is used for a transmissive liquid crystal panel, the light-shielding film may be omitted. Specifically, it is possible to provide the bottom gate electrode with the function and the effect of the light-shielding film by adjusting the impurity concentration in the channel region, by adjusting the impurity concentration in the low-concentration impurity region, or by reducing the thickness of the base coat film provided between the silicon layer (semiconductor layer) and the bottom gate electrode, and in such a case, the light-shielding film may be omitted.

However, it is more preferable to provide a light-shielding film below the bottom gate electrode as in Embodiments 1 to 3 and 5, because with the light-shielding film, the light that enters from the bottom side of the bottom gate electrode can be blocked with ease, and the leak current can therefore be reduced more reliably.

In the above-mentioned description, an example in which a single thin-film transistor is used as a switching element of the pixel electrode was described, but the present invention is not limited to this. A plurality of (thin film) transistors that are connected in series can be used as a switching unit of the pixel electrode, for example.

INDUSTRIAL APPLICABILITY

The present invention is useful for a semiconductor device that can reduce the leak current even when the ON current is increased, an active matrix substrate and a display device using the semiconductor device.

DESCRIPTION OF REFERENCE CHARACTERS 1 liquid crystal display device (display device)
5 active matrix substrate
18 switching element (semiconductor device)
21 top gate electrode
23, 65 bottom gate electrode
24 source region
25, 27, 50, 51, 52, 53 low-concentration impurity region
26, 45 channel region
28 drain region
31, 67 light-shielding film
62 reflective electrode
SL silicon layer (semiconductor layer)
G, G1 to GN gate wiring line (first signal wiring line)
G' bottom gate wiring line (second signal wiring line)

The invention claimed is:
1. A semiconductor device including a transistor, the transistor comprising:
 a top gate electrode;
 a bottom gate electrode;
 a semiconductor layer disposed between said top gate electrode and said bottom electrode; and
 a light-shielding film disposed below said bottom gate electrode,
 wherein said bottom gate electrode is controlled to have a prescribed potential.

2. The semiconductor device according to claim 1, wherein, when said transistor is turned off, the potential of said bottom gate electrode is controlled such that accumulation occurs in a channel region of said semiconductor layer, and wherein, when said transistor is turned on, the potential of the bottom gate electrode is controlled such that said channel region goes into inversion from depletion.

3. The semiconductor device according to claim 1, wherein a potential of said top gate electrode is controlled by a gate signal from a first signal wiring line that is connected to said top gate electrode, and wherein the potential of said bottom gate electrode is controlled by capacitance coupling with said top gate electrode.

4. The semiconductor device according to claim 1, wherein a potential of said top gate electrode is controlled by a gate signal from a first signal wiring line that is connected to said top gate electrode, and wherein the potential of said bottom gate electrode is controlled by a bottom gate signal from a second signal wiring line that is connected to said bottom gate electrode.

5. An active matrix substrate comprising the semiconductor device according to claim 1.

6. A display device comprising the semiconductor device according to claim 1.

7. The semiconductor device according to claim 1, wherein the semiconductor layer has a source region, a drain region, a channel region, and low-concentration impurity regions, and wherein said bottom gate electrode is arranged so as to overlap said channel region, a part of said low-concentration impurity region, which is adjacent to said source region, and a part of said low-concentration impurity region, which is adjacent to said drain region.

8. The semiconductor device according to claim 7, wherein, in said semiconductor layer, said low-concentration impurity regions are formed so as to sandwich said channel region and so as to be offset from said top gate electrode.

9. A semiconductor device including a transistor, the transistor comprising:

a top gate electrode;
a bottom gate electrode;
a semiconductor layer disposed between said top gate electrode and said bottom electrode; and
a reflective electrode disposed above said top gate electrode,
wherein said bottom gate electrode is controlled to have a prescribed potential.

10. A semiconductor device including a transistor, the transistor comprising:

a top gate electrode;
a bottom gate electrode;
a semiconductor layer disposed between said top gate electrode and said bottom electrode; and
a reflective electrode disposed above said top gate electrode,
wherein said bottom gate electrode is controlled to have a prescribed potential.

11. The semiconductor device according to claim 10, wherein the semiconductor layer has a source region, a drain region, a channel region, and low-concentration impurity regions, and wherein said bottom gate electrode is arranged so as to overlap said channel region, a part of said low-concentration impurity region, which is adjacent to said source region, and a part of said low-concentration impurity region, which is adjacent to said drain region.

12. The semiconductor device according to claim 11, wherein, in said semiconductor layer, said low-concentration impurity regions are formed so as to sandwich said channel region and so as to be offset from said top gate electrode.

13. The semiconductor device according to claim 10, wherein, when said transistor is turned off, the potential of said bottom gate electrode is controlled such that accumulation occurs in a channel region of said semiconductor layer, and wherein, when said transistor is turned on, the potential of the bottom gate electrode is controlled such that said channel region goes into inversion from depletion.

14. The semiconductor device according to claim 10, wherein a potential of said top gate electrode is controlled by a gate signal from a first signal wiring line that is connected to said top gate electrode, and wherein the potential of said bottom gate electrode is controlled by capacitance coupling with said top gate electrode.

15. The semiconductor device according to claim 10, wherein a potential of said top gate electrode is controlled by a gate signal from a first signal wiring line that is connected to said top gate electrode, and wherein the potential of said bottom gate electrode is controlled by a bottom gate signal from a second signal wiring line that is connected to said bottom gate electrode.

16. An active matrix substrate comprising the semiconductor device according to claim 10.

17. A display device comprising the semiconductor device according to claim 10.

* * * * *